(12) United States Patent
Tuominen et al.

(10) Patent No.: US 9,966,361 B1
(45) Date of Patent: May 8, 2018

(54) ELECTRONICS PACKAGE HAVING A MULTI-THICKNESS CONDUCTOR LAYER AND METHOD OF MANUFACTURING THEREOF

(71) Applicant: General Electric Company, Schenectady, NY (US)

(72) Inventors: Risto Ilkka Tuominen, Tokyo (JP); Arun Virupaksha Gowda, Rexford, NY (US)

(73) Assignee: General Electric Company, Schenectady, NY (US)

( * ) Notice: Subject to any disclaimer, the term of this patent is extended or adjusted under 35 U.S.C. 154(b) by 0 days. days.

(21) Appl. No.: 15/343,248

(22) Filed: Nov. 4, 2016

(51) Int. Cl.
*H01L 23/48* (2006.01)
*H01L 23/52* (2006.01)
(Continued)

(52) U.S. Cl.
CPC ...... *H01L 25/0652* (2013.01); *H01L 23/3128* (2013.01); *H01L 23/485* (2013.01)

(58) Field of Classification Search
CPC ............. H01L 25/0652; H01L 23/3128; H01L 23/485
(Continued)

(56) References Cited

U.S. PATENT DOCUMENTS 7,791,897 B2  9/2010  Das et al.
8,049,338 B2  11/2011  Delgado et al.
(Continued)

FOREIGN PATENT DOCUMENTS

JP   2015177163 A    10/2015
WO   WO0067538    *  9/2000

OTHER PUBLICATIONS

Park et al., "Dielectric Composite Material with Good Performance and Process Ability for Embedding of Active and Passive Components into PCBs," Electronic Components and Technology Conference (ECTC), 2013 IEEE 63rd, pp. 1325-1331, Las Vegas, NV.
(Continued)

*Primary Examiner* — Cuong Q Nguyen
*Assistant Examiner* — Tong-Ho Kim
(74) *Attorney, Agent, or Firm* — Ziolkowsky Patent Solutions Group, SC

(57) ABSTRACT

An electronics package includes an insulating substrate and electrical components coupled to a first surface of the insulating substrate. A multi-thickness conductor layer is formed on a second surface of the insulating substrate opposite the first surface. The multi-thickness conductor layer extends through vias in the insulating substrate to connect with contact pads of the electrical components. The multi-thickness conductor layer has a first thickness in a region proximate the first electrical component and a second thickness in a region proximate the second electrical component, the first thickness greater than the second thickness. The electronics package also includes a first redistribution layer having a conductor layer formed atop a portion of the multi-thickness conductor layer having the second thickness. A top surface of the conductor layer is co-planar with or substantially co-planar with a top surface of a portion of the multi-thickness conductor layer having the first thickness.

24 Claims, 17 Drawing Sheets

(51) Int. Cl.
*H01L 25/065* (2006.01)
*H01L 23/485* (2006.01)
*H01L 23/31* (2006.01)

(58) Field of Classification Search
USPC .................................................. 257/668, 775
See application file for complete search history.

(56) References Cited

U.S. PATENT DOCUMENTS

| | | |
|---|---|---|
| 8,114,712 B1 | 2/2012 | McConnelee et al. |
| 8,368,201 B2 | 2/2013 | Tuominen |
| 8,466,007 B2 | 6/2013 | Delgado et al. |
| 8,716,870 B2 | 5/2014 | Gowda |
| 8,778,738 B1 | 7/2014 | Lin et al. |
| 8,987,876 B2 | 3/2015 | Gowda et al. |
| 9,177,957 B1 | 11/2015 | Lee et al. |
| 9,209,151 B2 | 12/2015 | Chauhan et al. |
| 2007/0155057 A1 | 7/2007 | Wang |
| 2007/0235810 A1* | 10/2007 | Delgado ............. H01L 23/5389 257/356 |
| 2008/0136002 A1 | 6/2008 | Yang |
| 2008/0296056 A1 | 12/2008 | Kinoshita et al. |
| 2008/0318027 A1 | 12/2008 | Woychik et al. |
| 2009/0039510 A1 | 2/2009 | Jobetto |
| 2009/0072379 A1* | 3/2009 | Ewe .................... H01L 21/4821 257/700 |
| 2010/0052129 A1 | 3/2010 | Iihola et al. |
| 2010/0059854 A1* | 3/2010 | Lin ........................ H01L 25/16 257/528 |
| 2011/0068461 A1 | 3/2011 | England |
| 2012/0018876 A1 | 1/2012 | Wu et al. |
| 2013/0075924 A1 | 3/2013 | Lin et al. |
| 2013/0093097 A1 | 4/2013 | Yu et al. |
| 2014/0264799 A1* | 9/2014 | Gowda ............... H01L 23/3677 257/675 |
| 2015/0115458 A1 | 4/2015 | Palm |
| 2015/0179616 A1 | 6/2015 | Lin et al. |
| 2015/0380356 A1 | 12/2015 | Chauhan et al. |
| 2016/0056136 A1 | 2/2016 | McConnelee et al. |
| 2016/0148887 A1 | 5/2016 | Yu et al. |
| 2016/0172344 A1 | 6/2016 | We et al. |

OTHER PUBLICATIONS

Braun et al., "Through Mold Vias for Stacking of Mold Embedded Packages," Electronic Components and Technology Conference (ECTC), 2011 IEEE 61st, pp. 48-54, May 31, 2011-Jun. 3, 2011, Lake Buena Vista, FL.

* cited by examiner

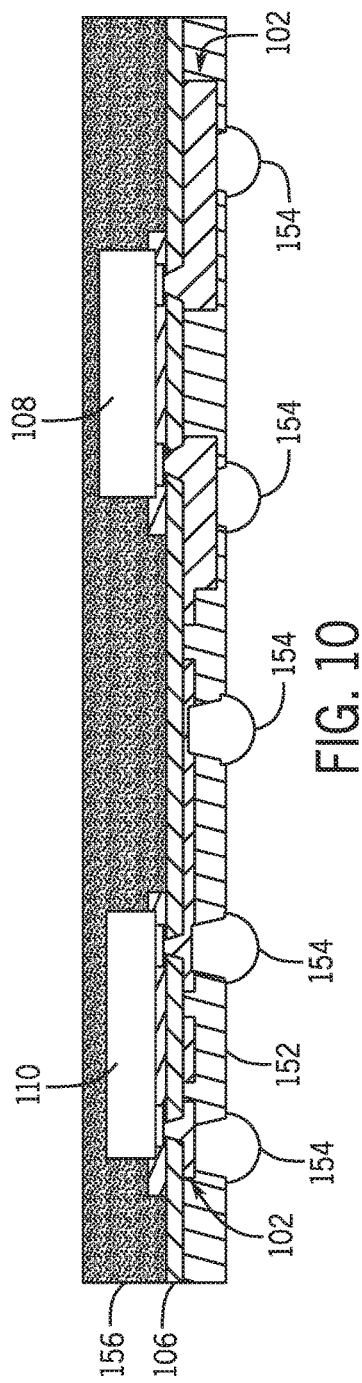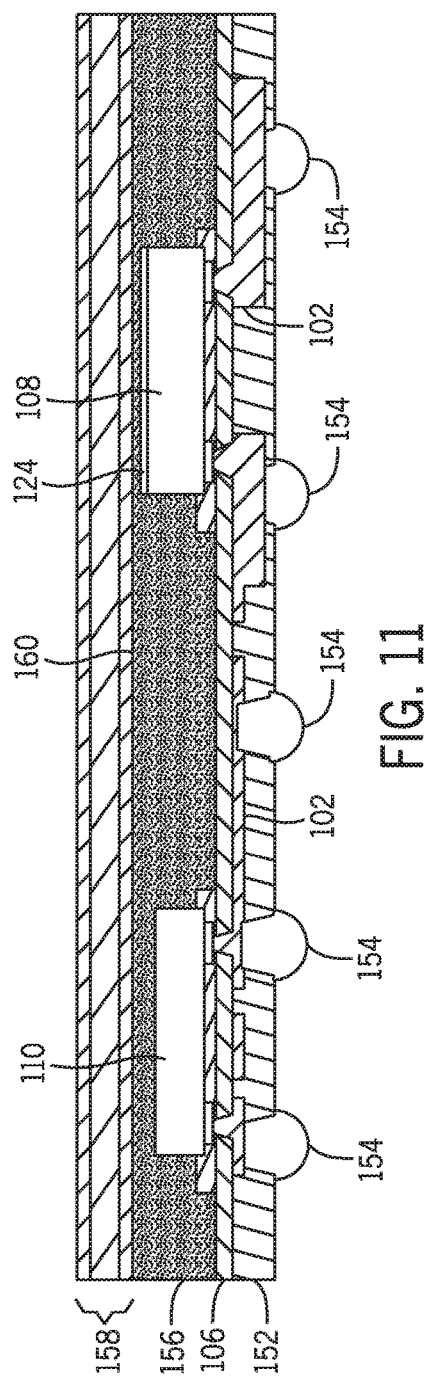

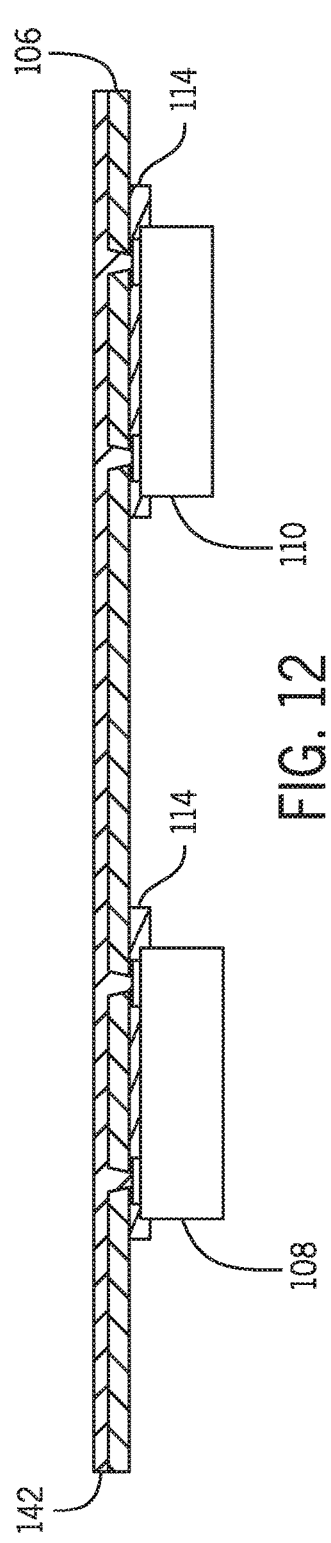
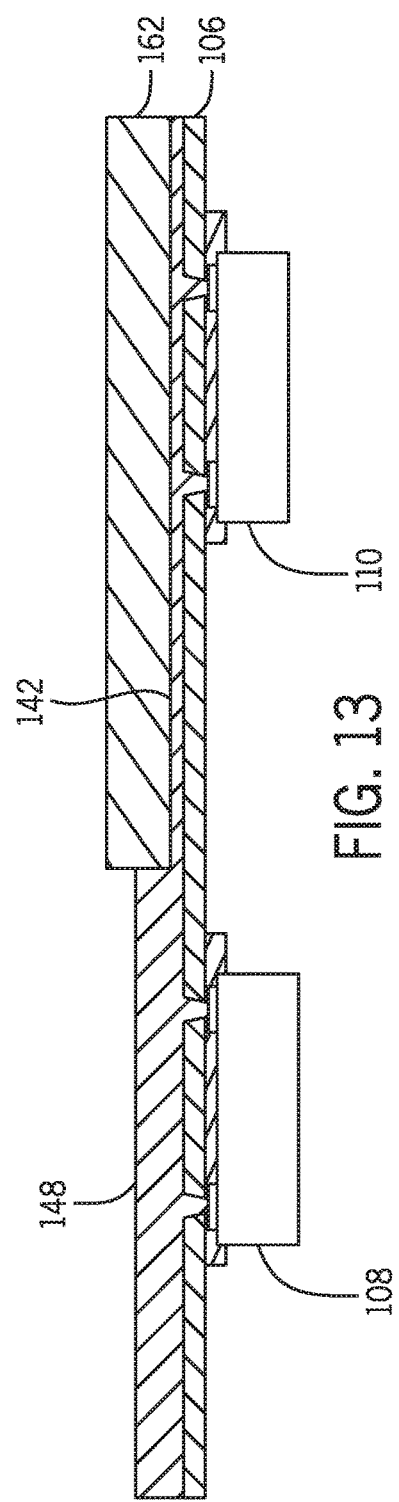

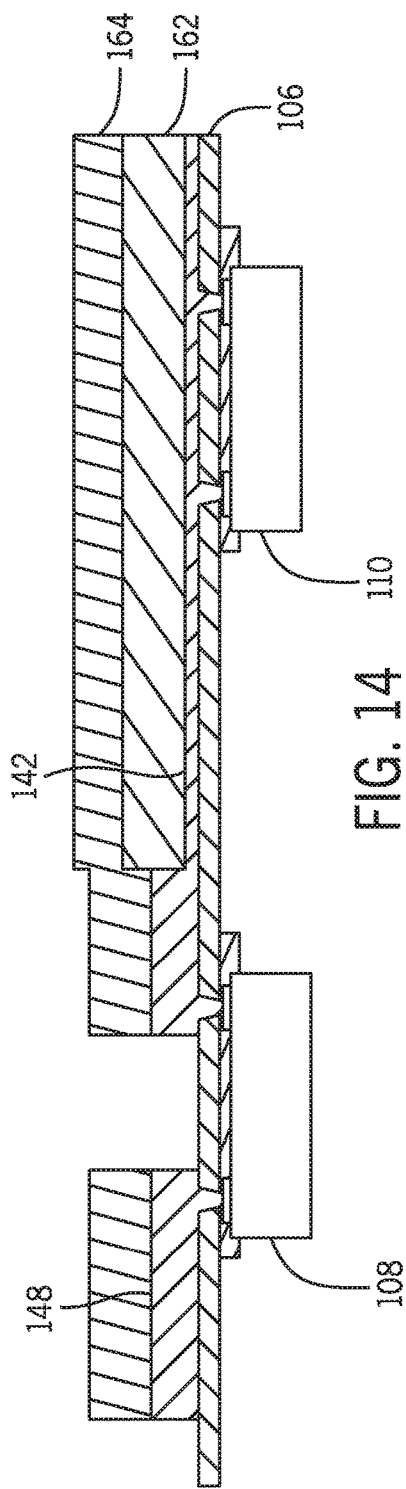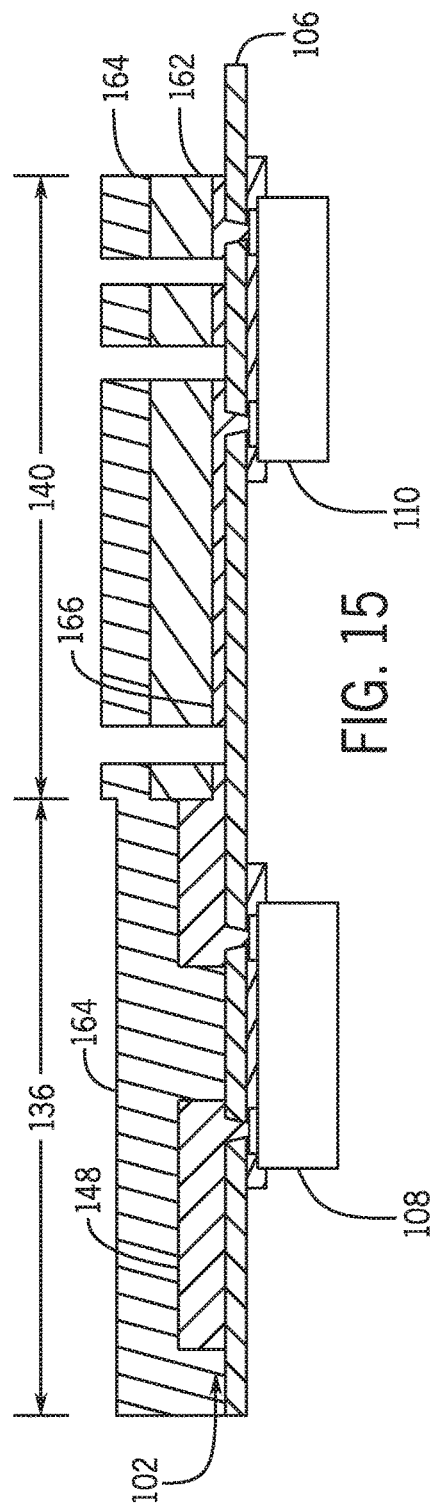

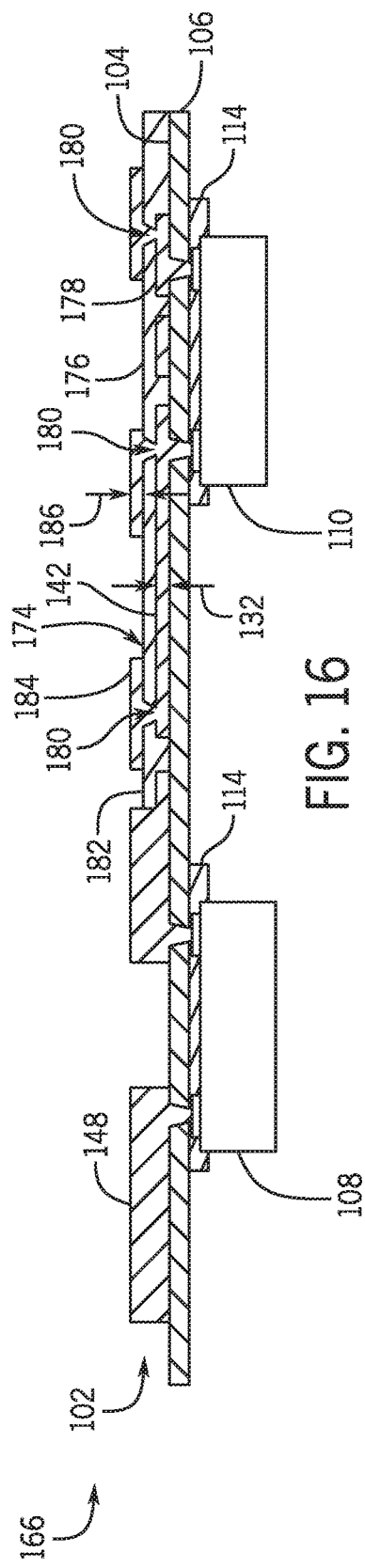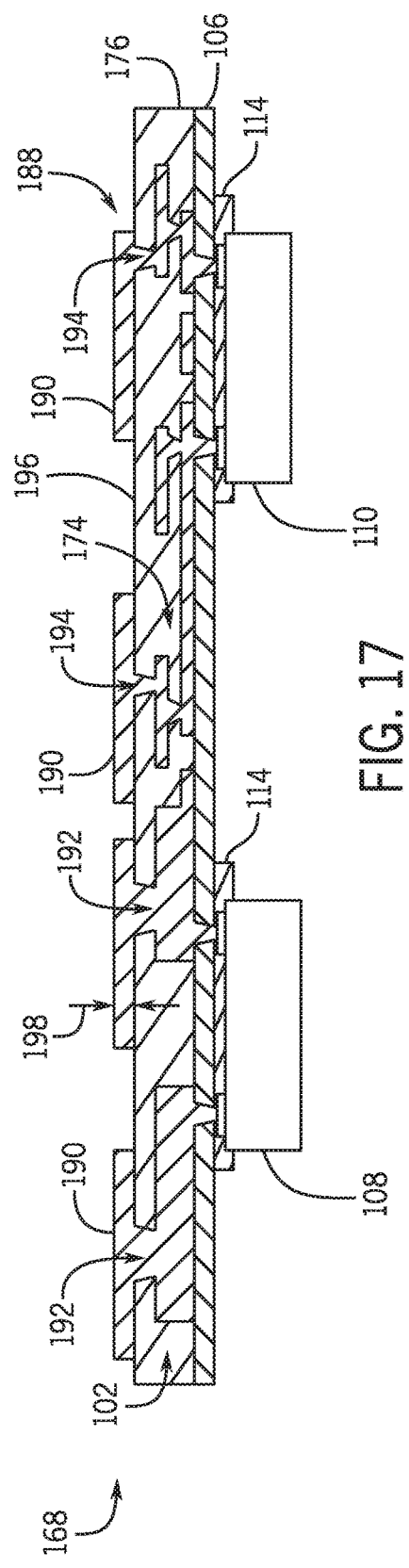

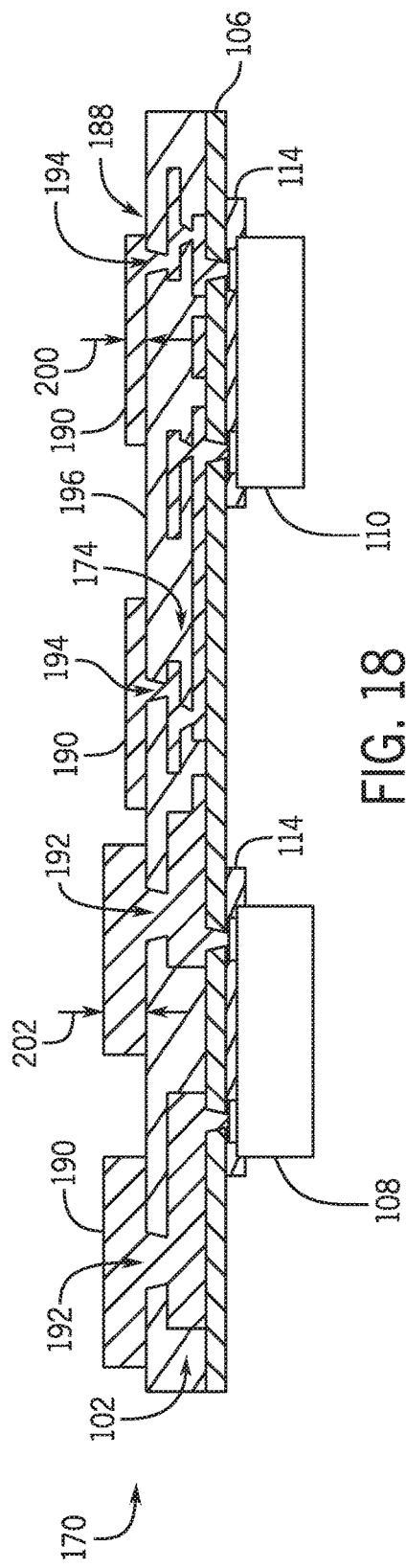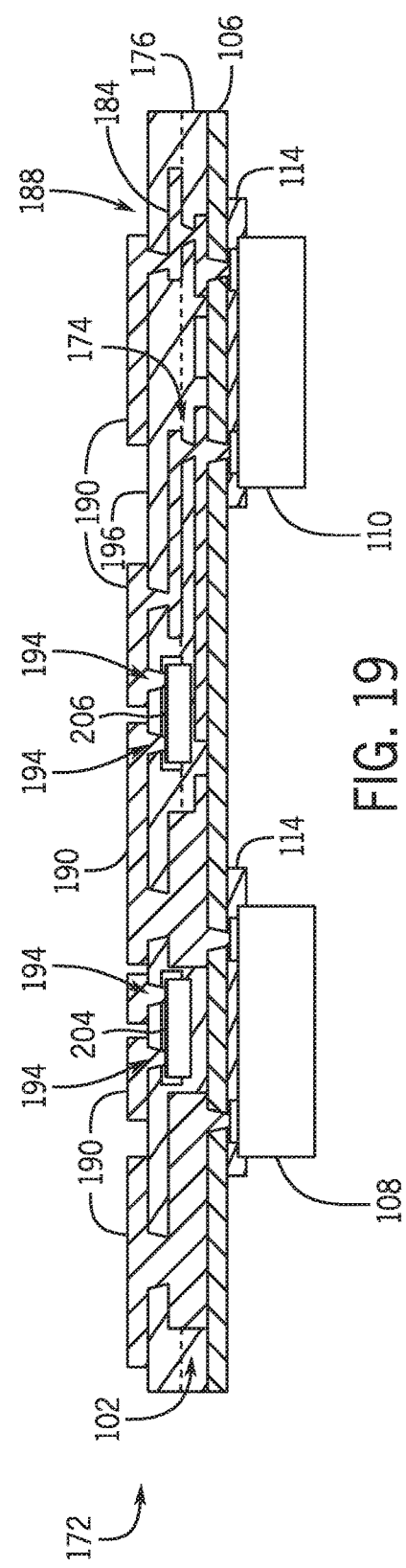

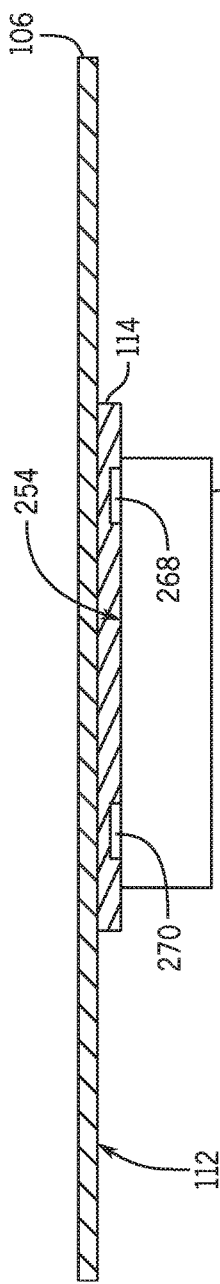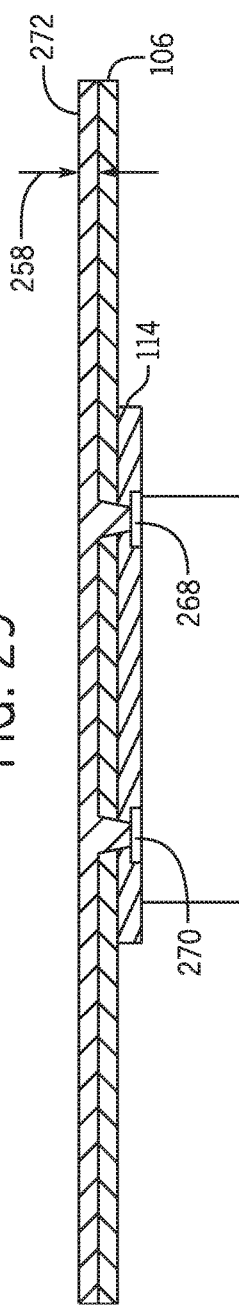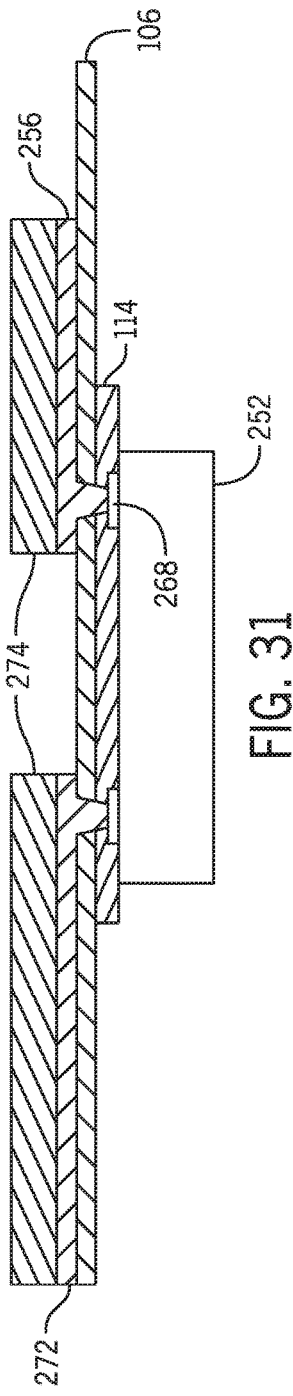

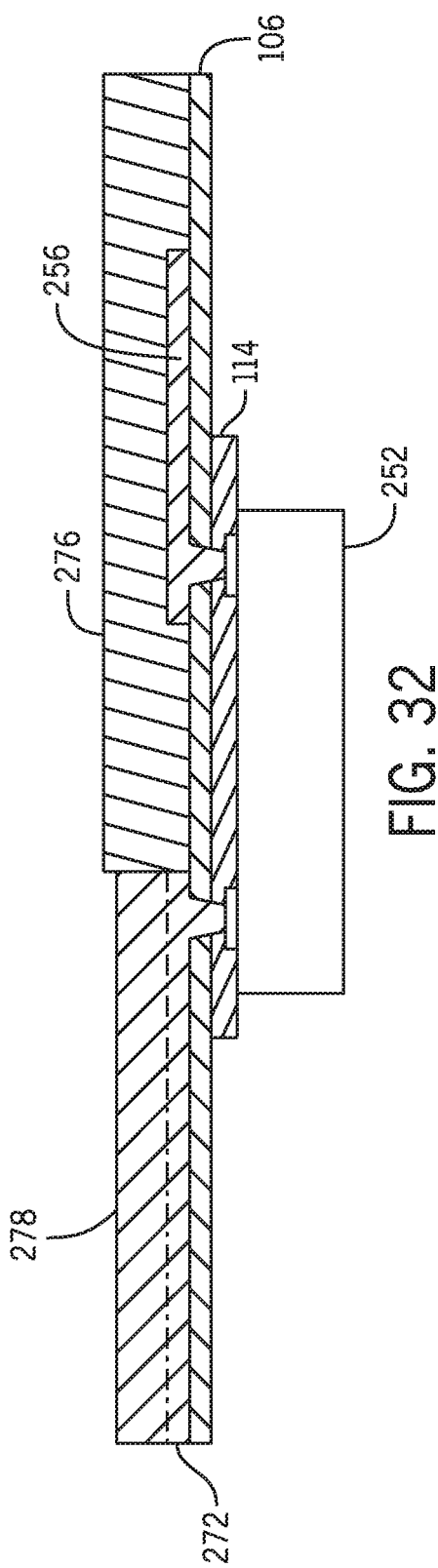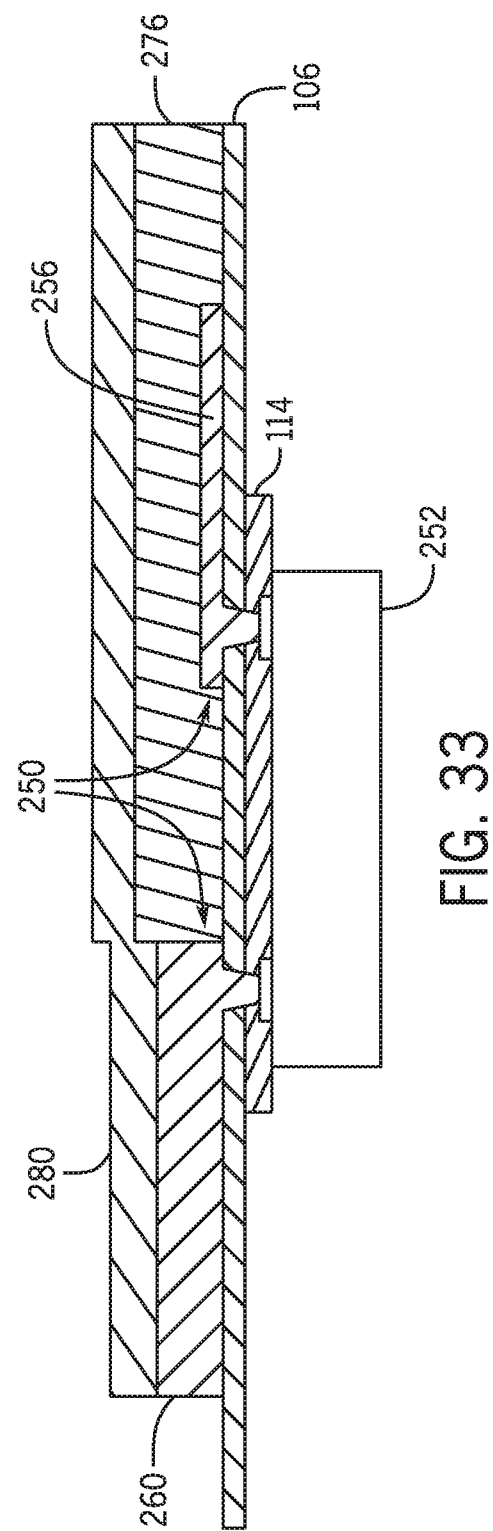

ELECTRONICS PACKAGE HAVING A MULTI-THICKNESS CONDUCTOR LAYER AND METHOD OF MANUFACTURING THEREOF

BACKGROUND OF THE INVENTION

Embodiments of the invention relate generally to semiconductor device packages or electronics packages and, more particularly, to an electronics package that includes a conductor layer with locally varied thicknesses. This multi-thickness conductor layer combines high current carrying capabilities and a high density interconnection structure into a common horizontal plane, which facilitates the integration of different types of electronics devices in a miniaturized package topology.

As semiconductor device packages have become increasingly smaller and yield better operating performance, packaging technology has correspondingly evolved from leaded packaging, to laminated-based ball grid array (BGA) packaging, to chip scale packaging (CSP), then flipchip packages, and now buried die/embedded chip build-up packaging. Advancements in semiconductor chip packaging technology are driven by ever-increasing needs for achieving better performance, greater miniaturization, and higher reliability.

A challenge to existing manufacturing techniques is the miniaturization of electronics packages that incorporate different types of individually packaged semiconductor dies that have different current carrying and routing density requirements, such as a mixture digital semiconductor devices and power semiconductor devices. The general structure of a prior art electronics package 10 incorporating a number of individually packaged components 12, 14, 16, 18 is shown in FIG. 1. The individually packaged components 12, 14, 16, 18 are mounted on a multi-layer printed circuit board (PCB) 20 that has a thickness 22 of approximately 31 to 93 mils. The individually packaged components 12, 14, 16, 18 may be power semiconductor packages, packaged controllers, or other discrete electrical components such as inductors or passive components that are coupled to electrical contacts 24 of PCB 20 using metalized connections 26 such as, for example, solder balls in the form of a ball grid array (BGA).

In the illustrated example, individually packaged devices 14, 16 each include a respective semiconductor device or die 28, 30 having contact pads 32 formed on an active surface thereof. Die 28, 30 are provided on a mounting platform 34, 36 and encased within an insulating material 38, 40. Wirebonds 42, 44 form direct metal connections between active surfaces of respective die 28, 30 and a metalized input/output (I/O) provided on or coupled to the lower surface of die 28, 30. In the case of discrete component 14, wirebonds 42 form an electrical connection between contact pads 32 of die 28 to I/O pads 46 provided on a bottom surface of discrete component 14. Wirebond 42 electrically couples contact pads 32 to I/O leads 48. Where die 30 is a diode, for example, wirebond 42 may connect to the anode on a first surface of the die 30 and a second surface of the die 30 may be soldered to the leadframe. I/O pads 46 and I/O leads 48 are coupled to electrical contacts 24 of PCB 20 by way of metalized connections 26. The overall thickness 50 of such prior art IC packages may be in the range of 500 µm-2000 µm or larger.

Alternatively, electrical connections between components may be realized using a combination of thick and thin conductor layers that are electrically connected to the appropriate semiconductor dies or power devices using through hole or via technology. However, inclusion of multiple routing layers adds considerable thickness to the overall electronics package, a factor that in combination with the complex conductor structure, limits product level miniaturization, design flexibility, and cost efficiency. Additionally, both of the aforementioned techniques include multiple routing layers, which results in a long and complex conductor structure between electrical components and weakens the electrical performance of the overall package, which is increasingly unfavorable in high performance packaging (e.g., high frequency, RF, intelligent power, and other advanced electronics packaging).

Accordingly, it would be desirable to provide a new electronics packaging technology that permits electrical components of different types to be integrated into a highly miniaturized electronics package with locally enhanced electrical and thermal conductivity for certain electronics components and increased routing density in regions proximate other electronics components. It would further be desirable for such a packaging technology to permit a shorter conductor length between electrical components and improve signal fidelity.

BRIEF DESCRIPTION OF THE INVENTION

In accordance with one aspect of the invention, an electronics package includes an insulating substrate, a first electrical component coupled to a first surface of the insulating substrate, and a second electrical component coupled to a first surface of the insulating substrate. A multi-thickness conductor layer is formed on a second surface of the insulating substrate opposite the first surface. The multi-thickness conductor layer extends through vias in the insulating substrate to connect with at least one contact pad of the first electrical component and at least one contact pad of the second electrical component. The multi-thickness conductor layer has a first thickness in a region proximate the first electrical component and a second thickness in a region proximate the second electrical component, the first thickness greater than the second thickness. The electronics package also includes a first redistribution layer having a conductor layer formed atop a portion of the multi-thickness conductor layer having the second thickness. A top surface of the conductor layer is co-planar with or substantially co-planar with a top surface of a portion of the multi-thickness conductor layer having the first thickness.

In accordance with another aspect of the invention, a method of manufacturing an electronics package includes providing an insulating substrate, coupling a first electrical component and a second electrical component to a first surface of the insulating substrate, and forming a multi-thickness conductor layer on a second surface of the insulating substrate, opposite the first surface. The multi-thickness conductor layer extends through a plurality of vias in the insulating substrate to electrically couple with contact pads of the first and second electrical components and has a first thickness in a region proximate the first electrical component and a second thickness in a region proximate the second electrical component, the first thickness greater than the second thickness. The method also includes forming a first redistribution layer atop a portion of the multi-thickness conductor layer having the second thickness, the first redistribution layer including a conductor layer having a top surface co-planar with or substantially co-planar with a top surface of a portion of the multi-thickness conductor layer having the first thickness.

In accordance with yet another aspect of the invention, an electronics package includes an insulating substrate, a first electrical component having an active surface with at least one contact pad positioned thereon coupled to a first surface of the insulating substrate, and a second electrical component having an active surface with at least one contact pad positioned thereon coupled to the first surface of the insulating substrate. A first conductor layer is disposed on a second surface of the insulating substrate and extending through metallized vias formed through a thickness of the insulating substrate. The first conductor layer has a region with a first thickness electrically coupled to at least one contact pad on the active surface of the first electrical component. The first conductor layer also has a region with a second thickness electrically coupled to at least one contact pad on the active surface of the second electrical component. The electronics package also includes a second conductor layer disposed atop a portion of the first conductor layer having the second thickness. The second conductor layer has a top surface that is co-planar with or substantially co-planar with a top surface of a portion of the first conductor layer having the first thickness.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings:

FIG. 10 is a schematic cross-sectional side view of an electronics package including an insulating material surrounding the electrical components, according to another embodiment of the invention.

FIG. 11 is a schematic cross-sectional side view of an electronics package including a direct bond copper (DBC) substrate, according to another embodiment of the invention.

FIGS. 12-15 are schematic cross-sectional side views of the electronics package of FIG. 2 during various stages of a manufacturing/build-up process, according to another embodiment of the invention.

FIG. 16 is a schematic cross-sectional view of an electronics package, according to another embodiment of the invention.

FIG. 17 is a schematic cross-sectional view of an electronics package, according to yet another embodiment of the invention.

FIG. 18 is a schematic cross-sectional view of an electronics package, according to yet another embodiment of the invention.

FIG. 19 is a schematic cross-sectional view of an electronics package incorporating a stacked die structure, according to yet another embodiment of the invention.

FIGS. 29-33 are schematic cross-sectional side views of the electronics package of FIG. 27 during various stages of a manufacturing/build-up process, according to an embodiment of the invention.

DETAILED DESCRIPTION

Figure 1:
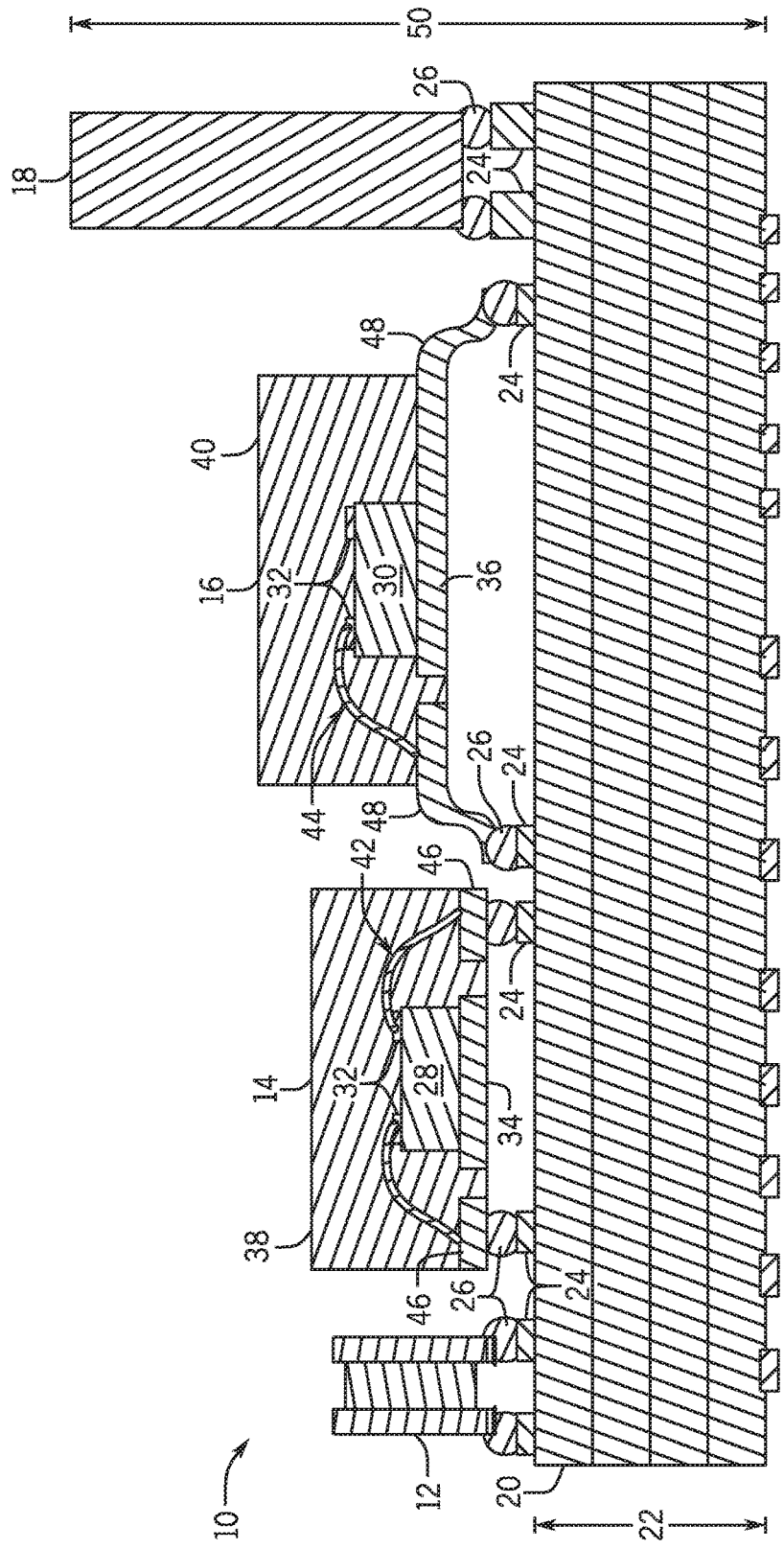
FIG. 1 is a schematic cross-sectional side view of a prior art electronics package incorporating a mixture of different types of semiconductor devices.

Embodiments of the present invention provide for an electronics package that includes multiple semiconductor devices, dies, or chips coupled to a patterned conductor layer with locally varied thicknesses. This multi-thickness conductor layer is contained within a common horizontal plane of the electronics package and includes regions having different routing density and current carrying capabilities, the benefits of which may be leveraged for I/O connections to a single electrical component or to multiple electrical components within the electronics package. As described in more detail below, in the case of a multi-chip module portions of the multi-thickness conductor layer include a low density routing pattern that provides the requisite current carrying capabilities for one type of electrical component, such as a power semiconductor die, while other, thinner portions of the conductor layer have a high density routing pattern that enables routing capability below 100/100 µm L/S for another type of electrical component, such as a digital semiconductor die.

As used herein, the phrase "power semiconductor device" refers to a semiconductor component, device, die or chip designed to carry a large amount of current and/or support a large voltage. Power semiconductor devices are typically used as electrically controllable switches or rectifiers in power electronic circuits, such as switched mode power supplies, for example. Non-limiting examples of power semiconductor devices include insulated gate bipolar transistors (IGBTs), metal oxide semiconductor field effect transistors (MOSFETs), bipolar junction transistors (BJTs), integrated gate-commutated thyristors (IGCTs), gate turn-off (GTO) thyristors, Silicon Controlled Rectifiers (SCRs), diodes or other devices or combinations of devices including materials such as Silicon (Si), Silicon Carbide (SiC), Gallium Nitride (GaN), and Gallium Arsenide (GaAs). In use, power semiconductor devices are typically mounted to an external circuit by way of a packaging structure, with the packaging structure providing an electrical connection to the external circuit and also providing a way to remove the heat generated by the devices and protect the devices from the external environment. Typical power semiconductor devices include two (2) to four (4) input/output (I/O) interconnections to electrically connect both sides of a respective power semiconductor device to an external circuit.

As used herein, the phrase "digital semiconductor device" refers to a semiconductor component, device, die, or chip provided in the form of a digital logic device, such as a microprocessor, microcontroller, memory device, video processor, or an Application Specific Integrated Circuit (ASIC), as non limiting examples. As is understood in the art, digital semiconductor devices have reduced current carrying requirements and require increased routing density as compared to power semiconductor devices due to the differences in interconnection pitch and number of I/Os between the device types. A digital semiconductor device may include anywhere between ten and thousands of I/Os depending on the device configuration.

While the electrical components embedded in the electronics package are referenced below in the embodiments of FIGS. 2-19 specifically as one or more power semiconductor devices in combination with one or more digital semiconductor devices, it is understood that other combinations of differently configured electrical components could be substituted in the electronics package, and thus embodiments of the invention are not limited only to the embedding of power devices and digital devices in a common electronics package. That is, the technique of using locally varied planar conductor thicknesses may be extended to electronics packages with any combination of electrical components having differing current carrying capabilities and routing density structures. Thus, the electronics package embodiments described below should also be understood to encompass electronics packages including resistors, capacitors, inductors, filters, or other similar devices, provided either alone or in combination with one or more power or digital devices. Additionally, while the embodiments of FIGS. 2-19 are described as including one power device and one digital device, it is contemplated that the concepts described herein may be extended to electronics packages that include any combination of three or more electrical components.

Figure 2:
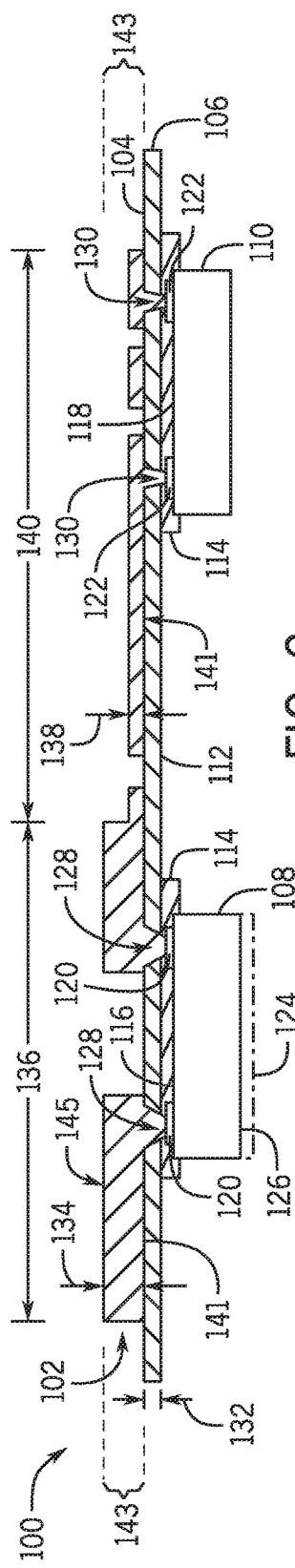
FIG. 2 is a schematic cross-sectional side view of an electronics package, according to an embodiment of the invention.

Referring now to FIG. 2, a cross-sectional schematic view of an electronics package 100 that combines high current carrying capability and a high density interconnection structure into a common horizontal plane is provided, according to an embodiment of the invention. The electronics package 100 includes a multi-thickness conductor layer 102 or metallization layer formed on a top surface 104 of an insulating substrate 106. According to various embodiments, insulating substrate 106 may be provided in the form of an insulating film or dielectric substrate, such as for example a Kapton® laminate flex, although other suitable materials may also be employed, such as Ultem®, polytetrafluoroethylene (PTFE), or another polymer film, such as a liquid crystal polymer (LCP) or a polyimide substrate, as non-limiting examples.

A number of semiconductor devices or die 108, 110 are coupled to a bottom surface 112 of insulating substrate 106. In the illustrated embodiment described herein, die 108 is a power semiconductor device and die 110 is a digital semiconductor device. However, electronics package 100 may include any combination of electrical components requiring different current carrying and routing density capabilities in alternative embodiments. In one embodiment, a layer of insulating material 114 is used to affix semiconductor devices 108, 110 to insulating substrate 106. As used herein the phrase "insulating material" refers to an electrically insulating material that adheres to surrounding components of the electronics package such as a polymeric material (e.g., epoxy, liquid crystal polymer, ceramic or metal filled polymers) or other organic material as non-limiting examples. In some embodiments, insulating material 114 may be provided in either an uncured or partial cured (i.e., B-stage) form. Alternatively, insulating material 114 may be applied to semiconductor devices 108 and/or 110 prior to placement on insulating substrate 106. In alternative embodiments, semiconductor devices 108, 110 may be affixed to insulating substrate 106 by way of an adhesive property of the insulating substrate 106 itself. In such an embodiment, insulating material 114 is omitted and insulating substrate 106 is provided in the form of a single dielectric layer having adhesive properties. Non-limiting examples of such an adhesive dielectric layer include a spin-on dielectric such as polymide or polybenzoxzaole (PBO).

As shown, semiconductor devices 108, 110 are positioned such that a top surface or an active surface 116, 118 comprising electrical contact pads 120, 122 or connection pads is positioned into insulating material 114. Contact pads 120, 122 provide conductive routes (I/O connections) to internal contacts within each semiconductor device 108, 110. Contact pads 120, 122 may have a composition that includes a variety of electrically conductive materials such as aluminum, copper, gold, silver, nickel, or combinations thereof as non-limiting examples. Depending upon the functionality and complexity of the semiconductor devices 108, 110, the number of contact pads 120, 122 on the respective semiconductor device 108, 110 are increased and the pad pitch (i.e., the center-to-center distance between adjacent contact pads) is reduced. In the case where power semiconductor device 108 is an IGBT, for example, contact pads 120, 122 are coupled to corresponding emitter and/or gate or anode regions of the semiconductor device 108. In the illustrated embodiment power semiconductor device 108 optionally also includes at least one lower contact pad 124 (shown in phantom) or collector pad that is disposed on its backside or lower surface 126. While not shown in the illustrated embodiment, it is contemplated that other types of electrical components, including discrete or passive devices, such as, for example, a resistor, a capacitor, or an inductor, may be affixed to insulating substrate 106 by way of insulating material 114.

Multi-thickness conductor layer 102 is an electrically conductive material that creates a series of electrical connections to the contact pads 120, 122 of power semiconductor device 108 and digital semiconductor device 110. In one embodiment, multi-thickness conductor layer 102 is formed of copper. However, other electrically conducting materials or a combination of metal and a filling agent may be used in other embodiments. As described in more detail below, multi-thickness conductor layer 102 may also include an interstitial seed metal layer (not shown). Multi-thickness conductor layer 102 extends through a series of vias 128, 130 formed through a thickness 132 of insulating substrate 106 to connect to contact pads 120, 122 on respective power and digital semiconductor devices 108, 110.

Figure 3:
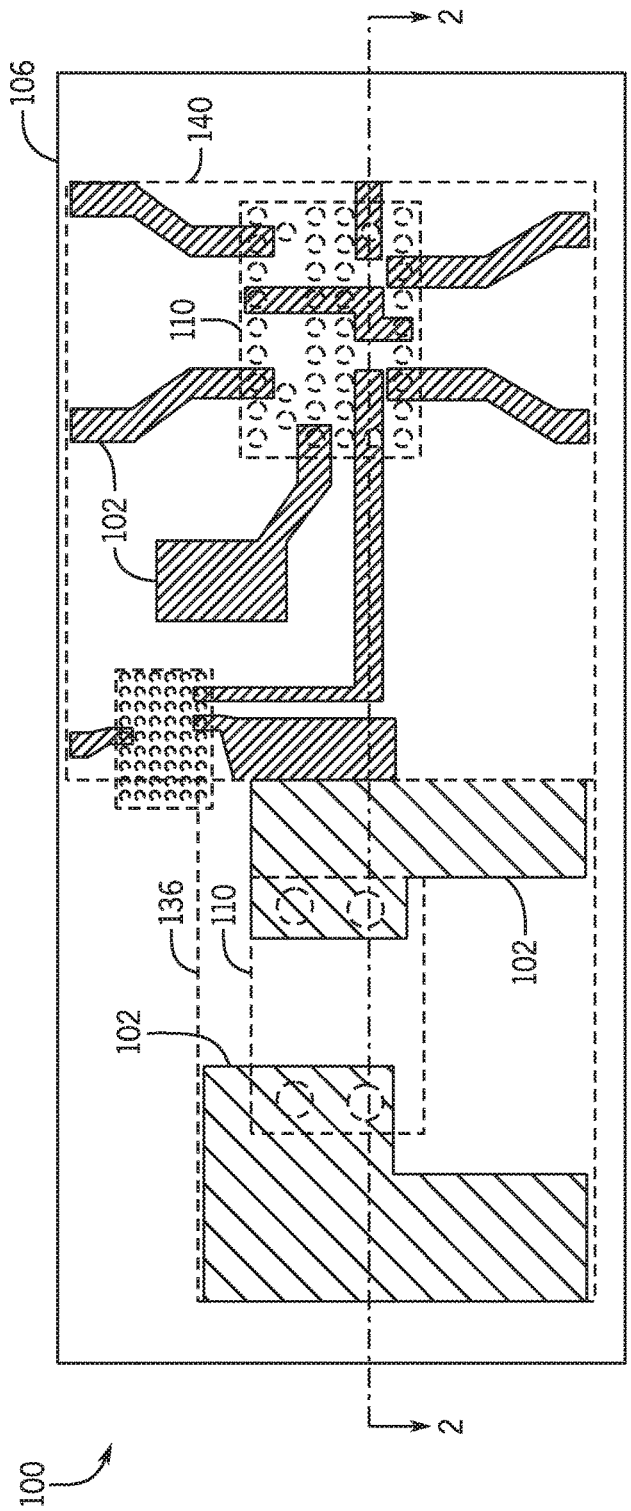
FIG. 3 is a schematic top view of the electronics package of FIG. 2.

Multi-thickness conductor layer 102 is fabricated having regions with locally varied planar thicknesses. As shown in FIGS. 2 and 3, multi-thickness conductor layer 102 has a first thickness 134 in a region 136 proximate power semiconductor device 108 and a second thickness 138 in a region 140 proximate digital semiconductor device 110. In the embodiments described herein, thickness 134 may be in the range of 25 μm-250 μm and thickness 138 may be in the range of 4 μm-30 μm. However, it is contemplated that multi-thickness conductor layer 102 may be formed having thicknesses outside these ranges of values in alternative embodiments. The bottom surface 141 of multi-thickness conductor layer 102 (i.e., the surface facing the top surface of insulating substrate 106) is co-planar or substantially co-planar. With the exception of the conductive material extending through vias 128, 130, multi-thickness conductor layer 102 is contained within a common horizontal plane 143 that is defined between the top surface 145 of multi-thickness conductor layer 102 within region 136 and bottom surface 141. Locating multi-thickness conductor layer 102 within this common horizontal plane 143 enables locating power and digital semiconductor devices 108, 110 in close proximity to one another while meeting the requisite interconnection pitch and current carrying capabilities for the respective semiconductor device 108, 110. While multi-thickness conductor layer 102 is described herein has having two different thicknesses, it is contemplated that the techniques described herein may be extended to fabricate a multi-thickness conductor layer having any number of different thicknesses selected to provide the desired routing density and current carrying capabilities for the assortment of electrical components within the electronics package.

Referring now to FIGS. 4-9, a technique for manufacturing the electronics package 100 of FIG. 2 is set forth, according to an embodiment of the invention in which a high-density L/S routing pattern is formed prior to formation of a low-density L/S routing pattern. A cross-section of the build-up process for a singular electronics package 100 is shown in each of FIGS. 4-9 for ease of visualization of the build-up process. However, one skilled in the art will recognize that multiple electronics packages could be manufactured in a similar manner at the panel level and then singulated into individual electronics packages as desired.

Figure 4:
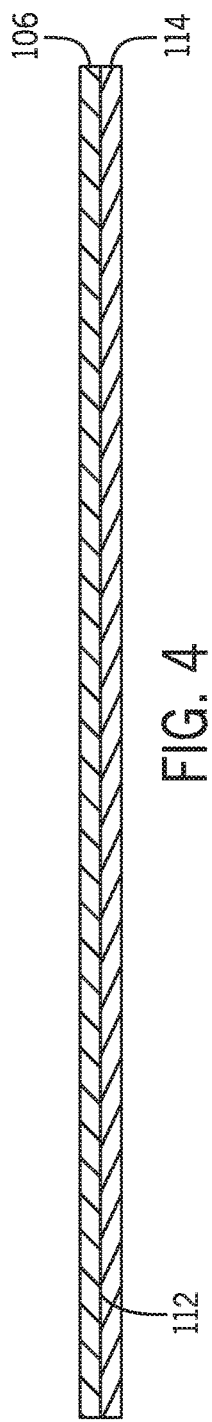
FIGS. 4-9 are schematic cross-sectional side views of the electronics package of FIG. 2 during various stages of a manufacturing/build-up process, according to an embodiment of the invention.

Referring first to FIG. 4, fabrication of electronics package 100 begins by applying insulating material 114 to a bottom surface 112 of insulating substrate 106. In the illustrated embodiment, insulating material 114 is applied such that it coats the entirety of the bottom surface 112. In alternative embodiments, insulating material 114 may be applied to coat only select portions of the bottom surface 112 of insulating substrate 106. Insulating material 114 may be applied using a coating technique such as spin coating or slot die coating, using a lamination or spray process, or may be applied by a programmable dispensing tool in the form of an inkjet printing-type device technique, as non-limiting examples.

Figure 5:
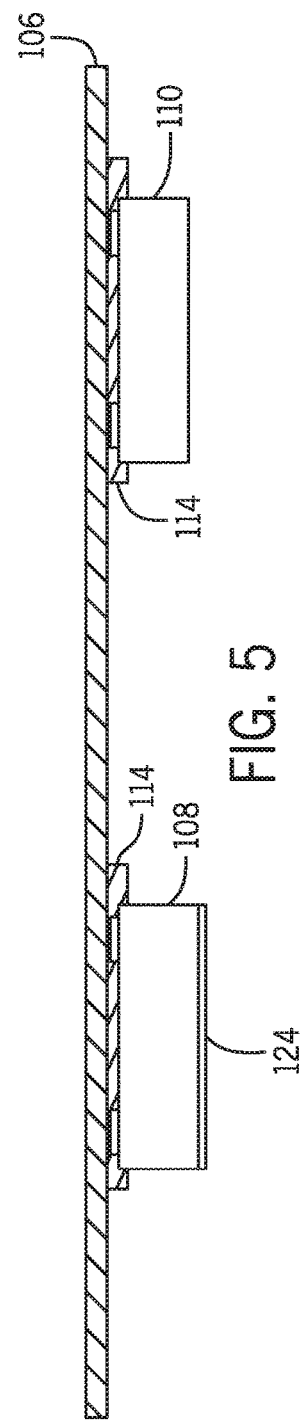

Semiconductor devices 108, 110 are coupled to insulating substrate 106 by positioning the active surfaces 116, 118 of the respective devices 108, 110 on the insulating material 114 using conventional pick and place equipment and methods, as shown in FIG. 5. After semiconductor devices 108, 110 are positioned, insulating material 114 is fully cured, thermally or by way of a combination of heat or radiation. Suitable radiation may include UV light and/or microwaves. In one embodiment, a partial vacuum and/or above atmospheric pressure may be used to promote the removal of volatiles from the adhesive during cure if any are present.

Figure 6:
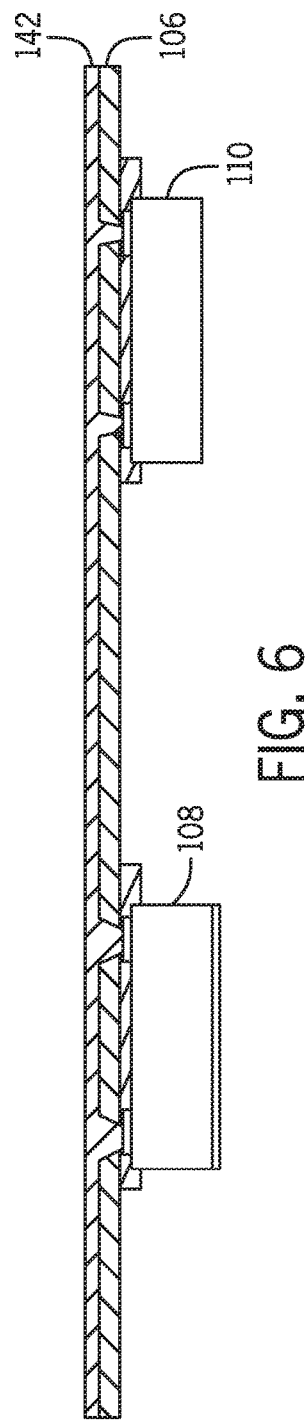

Referring now to FIG. 6 a plurality of vias 128, 130 are formed through insulating substrate 106 and insulating material 114 to expose contact pads 120, 122 of each semiconductor device 108, 110. Vias 128, 130 may be formed by a UV laser drilling or dry etching, photo-definition, or mechanical drilling process as non-limiting examples. Alternately, vias 128, 130 may be formed by way of other methods including: plasma etching, dry and wet etching, or other laser techniques like CO2 and excimer. In one embodiment, vias 128, 130 are formed having angled side surfaces, as shown in FIG. 6, to facilitate later filling and metal deposition. While the formation of vias 128, 130 through insulating substrate 106 and insulating material 114 is shown in FIG. 6 as being performed after placement of power semiconductor device 108 and digital semiconductor device 110 into insulating material 114, it is recognized that the placement of semiconductor devices 108, 110 could occur after via formation. Furthermore, a combination of pre- and post-drilled vias could be employed.

Upon securing semiconductor devices 108, 110 onto the insulating substrate 106 and following the formation of vias 128, 130, the vias 128, 130 are cleaned (such as through a reactive ion etching (RIE) desoot process or laser process) and subsequently metalized to form multi-thickness conductor layer 102. The manufacture of multi-thickness conductor layer 102 begins by forming a first conductor layer 142 on top surface 104 of insulating substrate 106 in a next step of the fabrication process, as shown in FIG. 6. In one embodiment, first conductor layer 142 is applied directly to the top surface 104 of insulating substrate 106 using a sputtering and electroplating technique, although it is recognized that other electroless methods of metal deposition could also be used. Alternatively, a titanium adhesion layer and copper seed layer (not shown) may first be applied to insulating substrate 106 via a sputtering process, followed by an electroplating process that increases a thickness of the first conductor layer 142 to a desired level.

First conductor layer 142 extends through vias 128, 130 and electrically couples with contact pads 120, 122 of semiconductor devices 108, 110. First conductor layer 142 is formed having a thickness 138 that enables a high density routing capability for digital semiconductor die 110. As used herein, the phrase "high density routing capability" refers to a routing capability below 100/100 μm L/S (line/space). In an exemplary embodiment, thickness 138 is in the range of approximately 4 μm-30 μm. However, one skilled in the art will recognize that the thickness 138 of first conductor layer 142 may be varied to correspond to the interconnection pitch of a particular digital semiconductor die 110.

Figure 7:
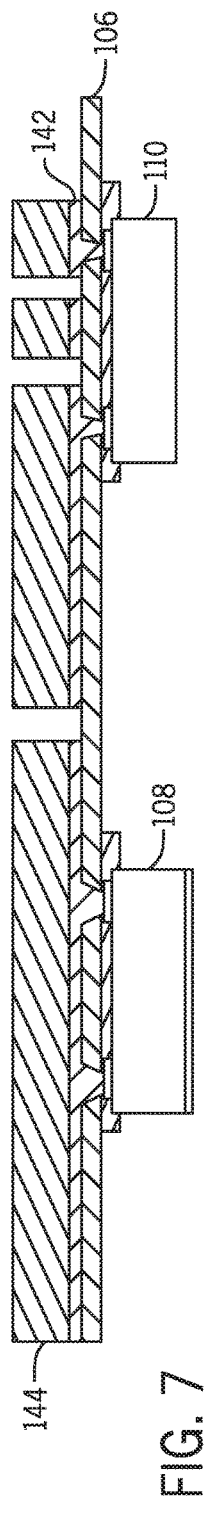
Figure 8:
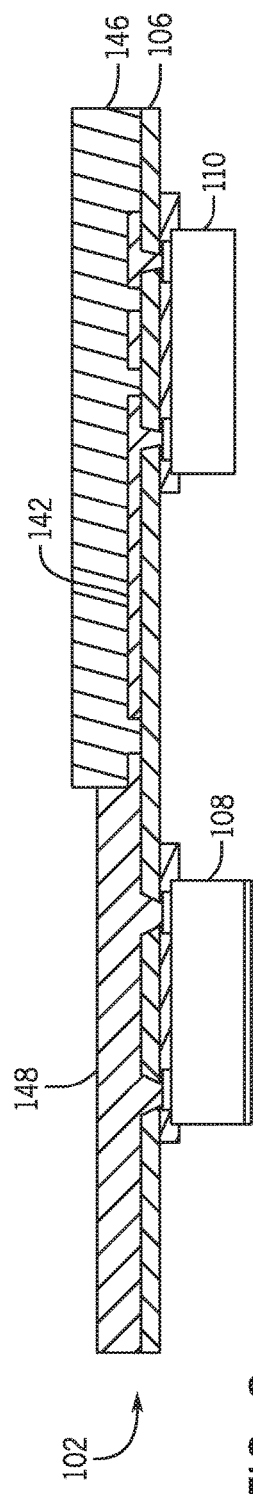

As shown in FIG. 7, a first layer photoresist mask 144 is formed on the first conductor layer 142 and is patterned with openings for a high density L/S pattern. With the first layer photoresist mask 144 in place, the first conductor layer 142 is subsequently patterned using an etching process. The process yields a patterned first conductor layer 142 as shown in FIG. 8 that extends out from contact pads 122 of digital semiconductor device 110, through vias 130, and out across the top surface 104 of insulating substrate 106.

After the first layer photoresist mask 144 is removed, a second layer photoresist mask 146 (FIG. 9) is formed atop the portions of first conductor layer 142 patterned with the high density L/S pattern. With the second layer photoresist mask 146 in place, a second conductor layer 148 is formed atop first conductor layer 142. In an exemplary embodiment, the combined thickness of first conductor layer 142 and second conductor layer 148 in the region 136 proximate the power semiconductor die 108 is approximately 75 μm or greater. Optionally, a seed metal layer (not shown), such as, for example, titanium-copper, may be applied using a sputter or evaporation technique prior to forming second conductor layer 148 to enhance adhesion between first conductor layer 142 and second conductor layer 148.

Figure 9:
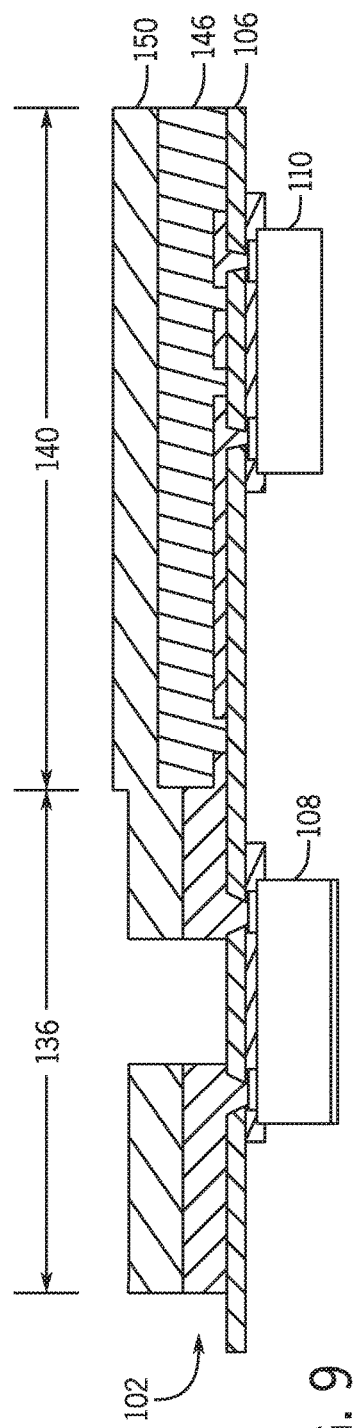

Referring now to FIG. 9, a third layer photoresist mask 150 is next applied to the second conductor layer 148. After the third layer photoresist mask 150 is patterned with a low density L/S pattern for the power semiconductor die 108, the portions of the second conductor layer 148 aligned with the low density L/S pattern are removed using an etching technique. The remaining portions of photoresist masks 146, 150 are removed using a stripping technique to expose the completed multi-thickness conductor layer 102 of electronics package 100, as shown in FIG. 2. In an alternative embodiment, one or both of the first and second conductor layers 142, 148 are formed from a photodefinable polymer using a semi-additive process.

As shown in FIGS. 10 and 11, a solder mask layer 152 may be applied over the multi-thickness conductor layer 102 of electronics package 100 to provide a protective coating and define interconnect pads. Interconnect pads may have a metal finish, such as Ni or Ni/Au, to aid solderability. A series of input/output (I/O) connections 154 are then formed to provide a route for electrical connections between the power semiconductor device 108, digital semiconductor device 110, and external components (not shown) such as, for example a busbar or printed circuit board (PCB). Such I/O connections 154 may be provided in the form of plated bumps or pillar bumps, as non-limiting examples.

In some embodiments, power semiconductor device 108 and digital semiconductor device 110 are overcoated with a layer of electrically insulating material 156 to provide rigidity and ease of handling and to prevent arcing between semiconductor devices and other metal components in high voltage applications. Such a configuration is applicable in embodiments where the power semiconductor device 108 is a lateral device that does not include a connection to the backside of the device 108.

An electrical connection to lower contact pad 124 of power semiconductor device 108 may be made using a conductive substrate 158, as shown in FIG. 11. Conductive substrate 158 may be an encapsulated metal lead frame or a multi-layer substrate such as, for example, a printed circuit board (PCB) or DBC substrate as shown in the illustrated embodiment that includes a non-organic ceramic substrate with upper and lower sheets of copper bonded to both sides thereof with a direct bond copper interface or braze layer. The electrical connection between conductive substrate 158 and power semiconductor die 108 is made through a conductive joining layer 160, such as solder, silver paste, or a conductive adhesive as examples, which is formed on lower contact pad 124. In such an embodiment, the connection between conductive substrate 158 and the lower contact pad 124 of power semiconductor device 108 is made prior to filling the volume between the conductive substrate 158 and the insulating substrate 106 with insulating material 156.

An alternative technique for manufacturing the electronics package 100 of FIG. 2 is illustrated in FIGS. 12-15. The manufacturing technique of FIGS. 12-15 differs from that of FIGS. 4-9 in that the low density L/S pattern is formed prior to or simultaneously with the high density L/S pattern, according to various embodiments. Similar to the manufacturing technique described with respect to FIGS. 4 and 5, fabrication of electronics package 100 begins by applying insulating material 114 to insulating substrate 106 and positioning the active surfaces 116, 118 of the respective devices 108, 110 on the insulating material 114, as shown in FIG. 12. After forming vias 128, 130 through insulating substrate 106, the first conductor layer 142 is plated atop insulating substrate 106 and extends through vias 128, 130.

Referring now to FIG. 13, a first photoresist mask 162 is applied to mask the portion of the first conductor layer 142 corresponding to the low density L/S pattern. With the first photoresist mask 162 in place, the second conductor layer 148 is plated atop the first conductor layer 142. A second photoresist mask 164 is then applied atop the second conductor layer 148 and the first photoresist mask 162, as shown in FIG. 14. Select portions of second photoresist mask 164 are removed to define a low density L/S pattern and an etching technique is used to remove the portions of the second conductor layer 148 exposed by the low density L/S pattern of the second photoresist mask 164.

Next, a high density L/S pattern is defined by removing select portions of the first photoresist mask 162 and the second photoresist mask 164 aligned with the first conductor layer 142. The exposed portions of first conductor layer 142 are removed using an etching technique resulting in the formation of the high density L/S pattern, as shown in FIG. 16. In an alternative embodiment, the high density L/S pattern and the low density L/S pattern are defined simultaneously by removing select portions of masks 162, 164 corresponding to both patterns in one step and subsequently etching the exposed portions of multi-thickness conductor layer 102. After etching of multi-thickness conductor layer 102 is complete, the remaining portions of first photoresist mask 162 and the second photoresist mask 164 are removed using a stripping technique to yield the electronics package 100 shown in FIG. 2.

FIGS. 16-19 illustrate electronics packages 166, 168, 170, 172 according to alternative embodiments of the invention. Each of electronics packages 166, 168, 170, 172 include components similar to components in electronics package 100 of FIG. 2, and thus numbers used to indicate components in FIG. 2 will also be used to indicate similar components in FIGS. 16-19. As described in more detail below, electronics packages 166, 168, 170, 172 include the components of electronics package 100 along with one or more additional redistribution layers.

Referring first to FIG. 16, electronics package 166 includes a redistribution layer 174 in addition to the components of electronics package 100. As shown, redistribution layer 174 includes an insulating substrate 176 formed on a top surface 178 of first conductor layer 142 and portions of the top surface 104 of insulating substrate 106 exposed following etching. Similar to insulating substrate 106 (FIG. 2), insulating substrate 176 may be provided in the form of an insulating film or dielectric. In the illustrated embodiment, insulating substrate 176 is secured to electronics package 100 by way of an adhesive property of the insulating substrate 176 or is provided in the form of a spun on or flowable film. In an alternative embodiment, an insulating material (not shown) is provided to couple insulating substrate 176 to electronics package 100. Vias 180 are formed between a top surface 182 of the insulating substrate 176 and the top surface 178 of the first conductor layer 142 such as by laser etching, for example.

A third conductor layer 184 is formed on the top surface 182 of insulating substrate 176 and extends through vias 180 to electrically connect with first conductor layer 142. Third conductor layer 184 functions as a routing layer for digital semiconductor die 110. In the illustrated embodiment, the thickness 186 of third conductor layer 184 is selected such that a combined thickness of first conductor layer 142, third conductor layer 184, and the dielectric therebetween is equal to or substantially equal to the thickness 134 of second conductor layer 148, such that the top surfaces of second and third conductor layers 148, 184 are co-planar or substantially co-planar. Similar to first conductor layer 142, third conductor layer 184 is an electrically conductive material such as, for example, copper, and may be formed using a sputtering and plating technique, followed by a lithography process. Together insulating substrate 176, vias 180, and third conductor layer 184 form the redistribution layer 174. It is contemplated that additional redistribution layers may be formed atop redistribution layer 174 as needed to achieve a desired routing pattern to contact pads 122 of digital semiconductor die 110.

Similar to electronics package 166, the electronics packages 168, 170 illustrated in FIGS. 17 and 18 include a redistribution layer 174 electrically coupled to digital semiconductor die 110 through first conductor layer 142. Electronics packages 168, 170 further include an additional redistribution layer 188 that is electrically coupled to power semiconductor die 108 and digital semiconductor die 110. As shown, this second redistribution layer 188 includes a conductor layer 190 that extends through vias 192, 194 formed in an insulating substrate 196. In the illustrated embodiments, insulating substrate 196 is formed of the same material as insulating substrate 176 and, therefore, is indistinguishable therefrom in the completed structure.

In the embodiment illustrated in FIG. 17, conductor layer 190 is formed having a uniform thickness 198 throughout. While one skilled in the art will recognize that the thickness 198 of conductor layer 190 will be selected based on a given application, thickness 198 is selected to be equal to or substantially equal to thickness 134 in one non-limiting embodiment. In the embodiment illustrated in FIG. 18, on the other hand, conductor layer 190 is a multi-thickness component with a portion coupled to the first conductor layer 142 having a first thickness 200 selected to achieve a desired high density routing pattern corresponding to digital semiconductor device 110 and a portion coupled to the second conductor layer 148 having a second thickness 202 that is greater than the first thickness 200 and having current carrying capabilities desired in connection with power semiconductor device 108. Conductor layer 190 is an electrically conductive material such as, for example, copper, and may be formed using a sputtering and plating technique, followed by a lithography process. Where conductor layer 190 is a multi-thickness component, conductor layer 190 may be formed using any of the techniques described above with respect to multi-thickness conductor layer 102.

The electronics package 172 illustrated in FIG. 19 utilizes openings formed within the various conductor layers for placement of one or more additional electronics components 204, 206. Conductor layer 190 of second redistribution layer 188 extends through vias 194 to electrically couple with the electronics components 204, 206, which are embedded within insulating material 176 of the first redistribution layer 174, insulating material 196 of the second redistribution layer 188, or a combination thereof. While two components 204, 206 are shown for illustrative purposes, it is contemplated that electronics package 172 may include a single component or any number of additional components based on design specifications. Electrical components 204, 206 may be, for example, relatively simple active or passive devices, such as, for example, a resistor, a capacitor, an inductor, or a diode. As shown, electrical component 204 is thinner than the second thickness 138 of multi-thickness conductor layer 102, which permits electronics components 204 to be integrated within a cavity formed within the low density L/S pattern of multi-thickness conductor layer 102 without increasing the overall thickness of the electronics package 172. Similarly, because electrical component 206 is thinner than the second conductor layer 148, the component can be integrated within the same horizontal plane as the low density redistribution layer 174.

Beneficially, use of the multi-layer conductor layer enables locating disparate electrical components much closer in proximity to each other than prior art techniques such as that shown in FIG. 1. The multi-layer conductor layer also provides a shorter and less complex conductor structure between electrical components as compared to the prior art techniques, thus improving the reliability of electrical connections within the packaging structure and improved signal attenuation.

While not shown in FIGS. 16-19, it is contemplated that electronics packages 166, 168, 170, and 172 may also include a layer of insulating material that surrounds and embeds the respective electrical component 108, 110 in a similar manner as insulating material 156 of FIGS. 10 and 11. In embodiments where electrical component 108, 110 includes one or more backside or lower contact pads, electronics packages 166, 168, 170, and 172 may further include a conductive substrate coupled thereto similar to conductive substrate 158 of FIG. 11.

Figure 20:
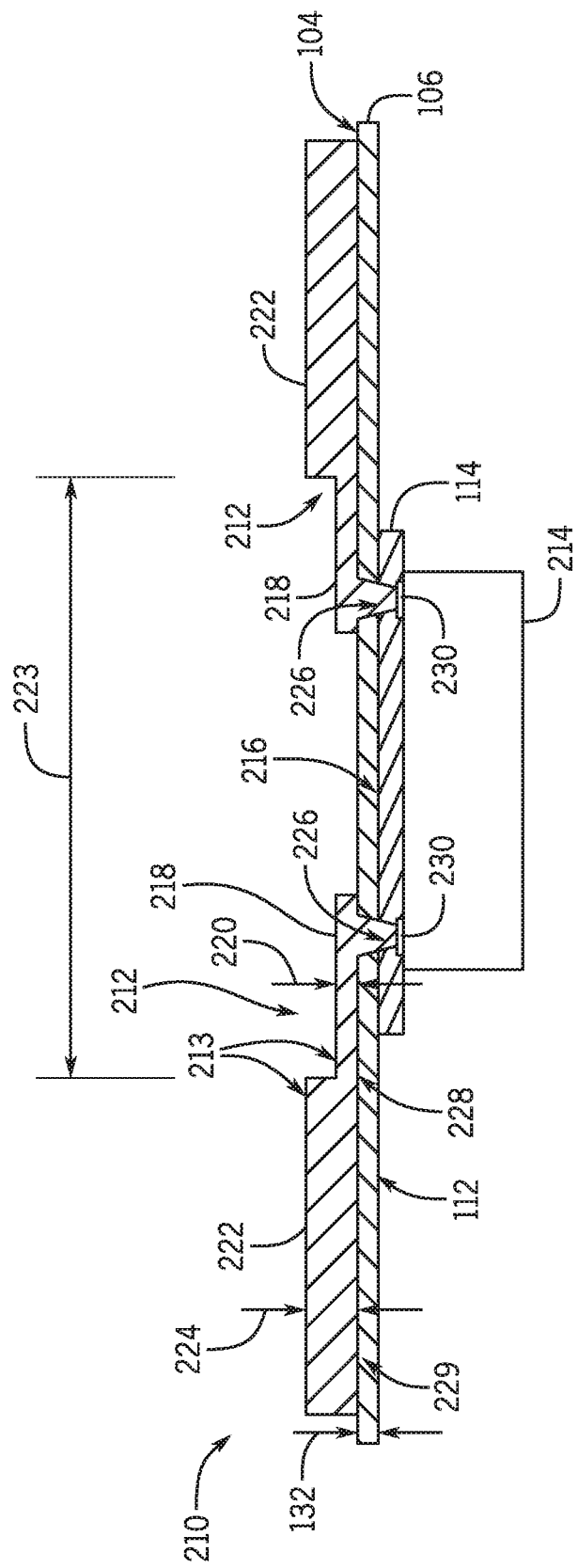
FIG. 20 is a schematic cross-sectional side view of an electronics package, according to yet another embodiment of the invention.

Referring now to FIG. 20, a cross-sectional schematic view of an electronics package 210 is shown that includes a conductive mounting assembly for an electrical component 214, the conductive mounting assembly comprising an insulating substrate 104 and a multi-thickness conductor layer 212 according to another embodiment of the invention. Electronics package 210 leverages the benefits of a multi-thickness conductor layer to reduce losses in the I/O connection between a single electrical component 214 and external devices, as described in more detail below. In the embodiment described herein, electrical component 214 is a digital semiconductor device. However, electrical component 214 may be a power semiconductor device or other type of electrical component in alternative embodiments. Additionally, while electronics package 210 is illustrated herein as including a single electrical component 214, it is contemplated that alternative embodiments may include multiple electrical components, each with multi-thickness conductor layers coupled thereto.

Similar to electronics package 100 (FIG. 2), multi-thickness conductor layer 212 is formed on a top surface 104 of insulating substrate 106. The top surface 216 or active surface of electrical component 214 is coupled to the bottom surface 112 of insulating substrate 106 by way of a layer of insulating material 114. In an alternative embodiment where insulating substrate 106 has adhesive properties, electrical component 214 is affixed directly to insulating substrate 106 and insulating material 114 is omitted.

Figure 21:
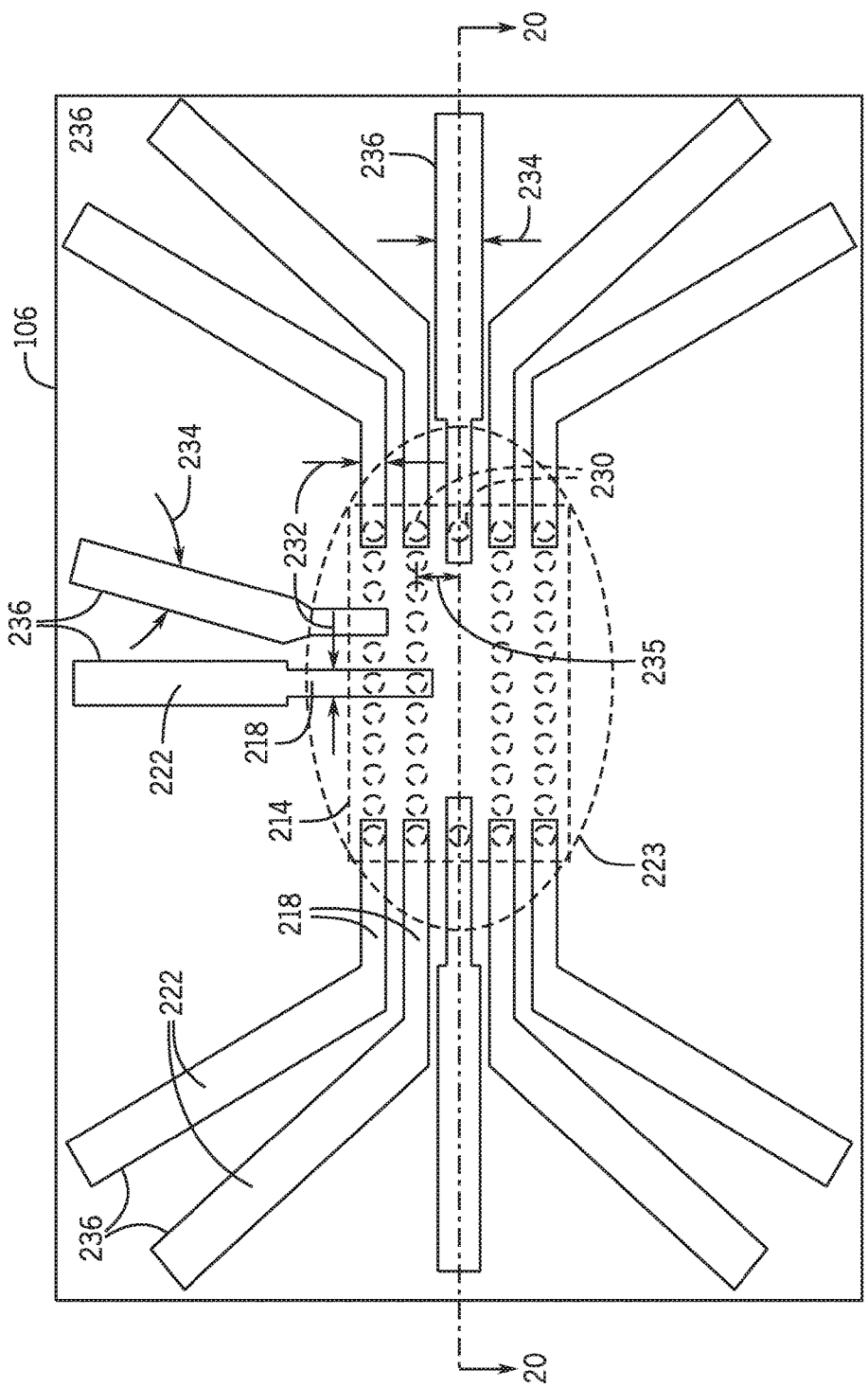
FIG. 21 is a schematic top view of the electronics package of FIG. 20.

As shown in FIG. 20, the top surface 213 of multi-thickness conductor layer 212 has a stepped configuration, with a first portion 218 having a first thickness 220 and a second portion 222 having a second thickness 224. The first portion 218 of multi-thickness conductor layer 212 extends downward from the bottom surface 228 through vias 226 in insulating substrate 106 to electrically couple with contact pad(s) 230 provided on top surface 216 of electrical component 214. The second portion 222 of multi-thickness conductor layer 212 is electrically coupled to the first portion 218, but is horizontally offset from vias 226 and the contact area of the electrical component 212 on the insulating substrate 106. As shown in FIGS. 20 and 21, the resulting arrangement of thinner first portion 218 and thicker second portion 222 is such that first portion 218 is located above and in the area directly adjacent the contact area of electrical component 212 and second portion 222 is located outside the region 223 of the insulating substrate 104 immediately surrounding the electrical component. The bottom surface 229 of the second portion 222 is co-planar or substantially coplanar, as shown in FIG. 20, and does not extend into any vias formed through insulating substrate 106. In the illustrated embodiment, the multi-thickness conductor layer 212 includes multiple traces or routing paths 236 that form electrical connections contact pads 230 of electrical component 214. In an alternative embodiment, multi-thickness conductor layer 212 may include a single trace or routing path that creates an I/O connection to a single contact pad of an electrical component.

In one embodiment, the first portion 218 of multi-thickness conductor layer 212 has a width 232 that is less than a width 234 of the second portion 222 of multi-thickness conductor layer 212, as shown in FIG. 21. The reduced width 232 of first portion 218 permits the traces or routing paths 236 of multi-thickness conductor layer 212 to be formed close to one another in the area proximate the electrical component 214 where space is limited. As the routing paths 236 extend away from the electrical component 214, the routing paths 236 transition to the wider width 234 and larger thickness 224 of second portion 222. In the embodiment shown in FIGS. 20 and 21, the second portions 222 of multi-thickness conductor layer 212 are formed having the larger thickness 224 over their overall length. In alternative embodiments, the wider second portion 222 of multi-thickness conductor layer 212 may be formed having the smaller thickness 220 for some portion of their overall length.

In the illustrated embodiment, the first portions 218 of adjacent routing paths 236 are arranged parallel or substantially parallel to one another while the second portions 222 thereof extend away from electrical component 214 in a substantially radial pattern. However, it is contemplated that the second portion 222 of multi-thickness conductor layer 212 may be formed having any number of alternative geometries or patterns to take advantage of the increased surface area available on the top surface of insulating substrate 106 away from electrical component 214. By increasing the thickness of the routing paths 236 in the region distant the electrical component 214, the routing path 236 may be formed having a shorter electrical delay than prior art configurations. Thus, the multi-thickness conductor layer 212 beneficially permits miniaturization of the overall electronics package 210 while allowing for lower loss connections, as the impedance of a given connection or trace is dependent on the length and cross-sectional area of the trace.

An exemplary technique for manufacturing the electronics package 210 of FIG. 20 is illustrated in FIGS. 22-26, according to one embodiment of the invention. As one skilled in the art will recognize, the technique described herein may be used to manufacture multiple electronics packages on the panel level, which may later be singulated into individual electronics packages having one or more electrical components therein.

Figure 22:
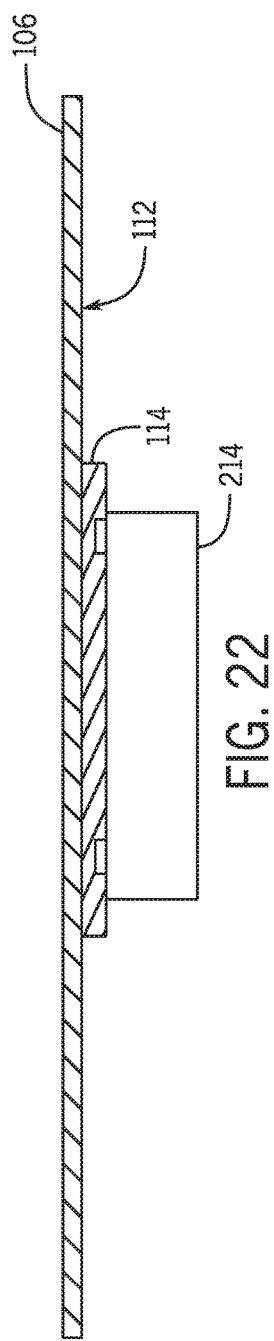
FIGS. 22-26 are schematic cross-sectional side views of the electronics package of FIG. 20 during various stages of a manufacturing/build-up process, according to an embodiment of the invention.
Figure 23:
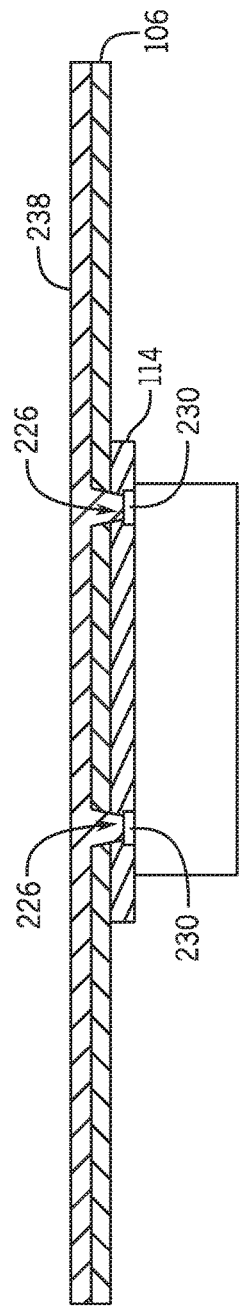
Figure 24:
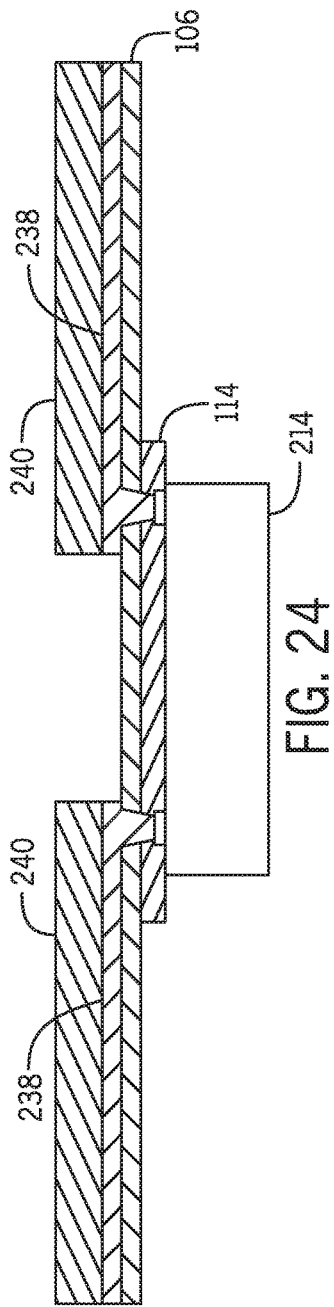
Figure 25:
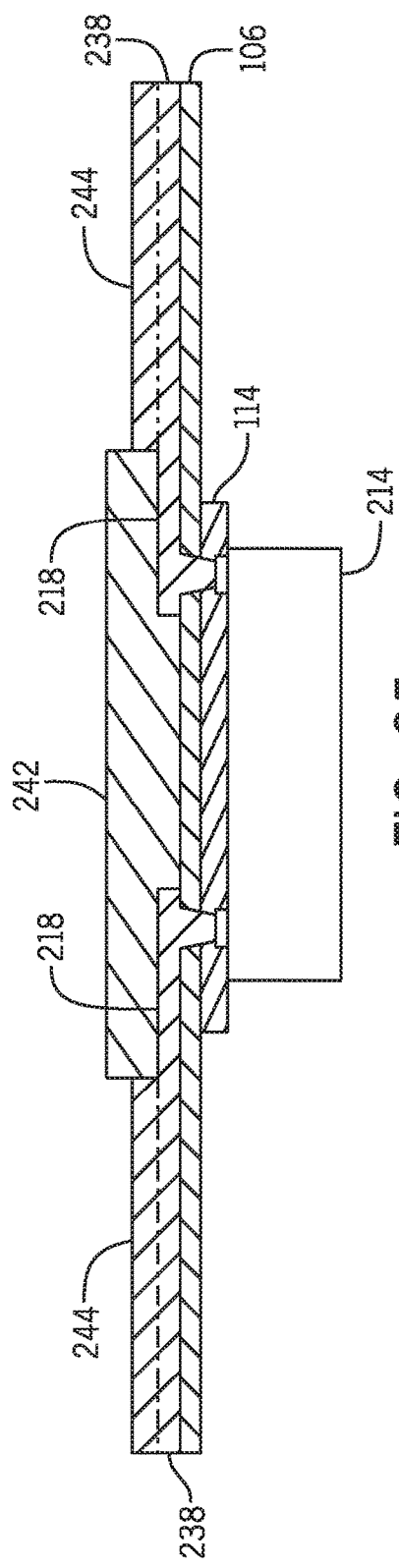

As shown in FIG. 22, the manufacture of electronics package 210 begins by coupling electrical component 214 to the bottom surface 112 of insulating substrate 106 using an insulating material 114 in a similar manner as described with respect to FIGS. 4 and 5. After the insulating material 114 is cured, vias 226 are formed through the insulating substrate 106 and insulating material 114 in a similar manner as described for vias 128, 130 (FIG. 6) to expose contact pads 230 of electrical component 214. Referring to FIG. 23, a first conductor layer 238 is formed on the top surface of insulating substrate using metal deposition technique such as, for example, a sputtering and electroplating technique or other electroless method. Optionally, an adhesion and seed layer (not shown) is applied to the top surface of insulating substrate 106 before forming first conductor layer 238 to aid in the adhesion of first conductor layer 238 to insulating substrate 106. Once formed, the first conductor layer 238 has a thickness 220 and extends into vias 226 to electrically couple with contact pads 230 of electrical component 214.

Next, a first layer photoresist mask 240 (FIG. 24) is formed on the first conductor layer 238. The first conductor layer 238 is subsequently patterned to define the first portion 218 of routing paths 236, which extend outward from contact pads 230 of electrical component 214. After first layer photoresist mask 240 is removed, a second layer photoresist mask 242 (FIG. 25) is formed to cover the first portion 218 of routing paths 236 and other regions of electronics package 210 that will be free of multi-thickness conductor layer 212. A second conductor layer 244 is then formed on the exposed portions of first conductor layer 238 using an electroplating process that builds upon first conductor layer 238 until the second portion 222 of multi-thickness conductor layer 212 has a second thickness 224. A dotted line is provided in FIGS. 24 and 25 for explanatory purposes to distinguish the position of first conductor layer 238 from that of second conductor layer 244. In the illustrated embodiment, the two conductor layers are formed of the same material and, thus, the two layers are not structurally distinguishable from one other aside from their geometry. In an alternative embodiment, an adhesion and seed layer (not shown) may be provided atop first conductor layer 244 prior to depositing second conductor layer 244 thereon.

Figure 26:
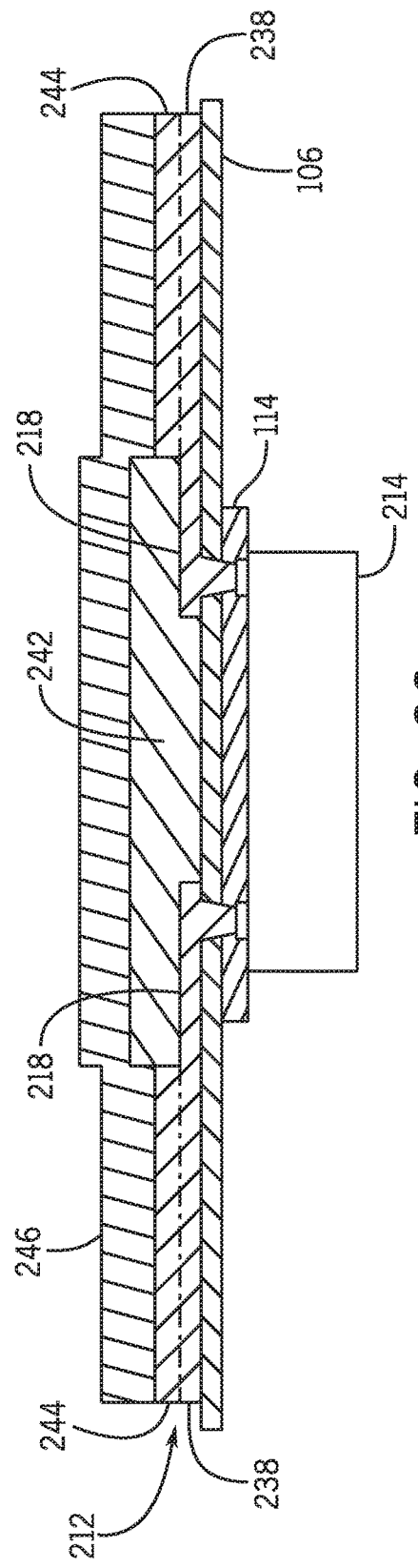

Referring now to FIG. 26, a third layer photoresist mask 246 is applied to cover the second layer photoresist mask 242 and define the geometry of the second portion 222 of multi-thickness conductor layer 212. The second conductor layer 244 is then patterned using an etching technique. Remaining portions of second layer photoresist mask 242 and third layer photoresist mask 246 are removed to expose the completed multi-thickness conductor layer 212, which has a stepped configuration resulting from the differing thicknesses of the first and second portions thereof.

Figure 27:
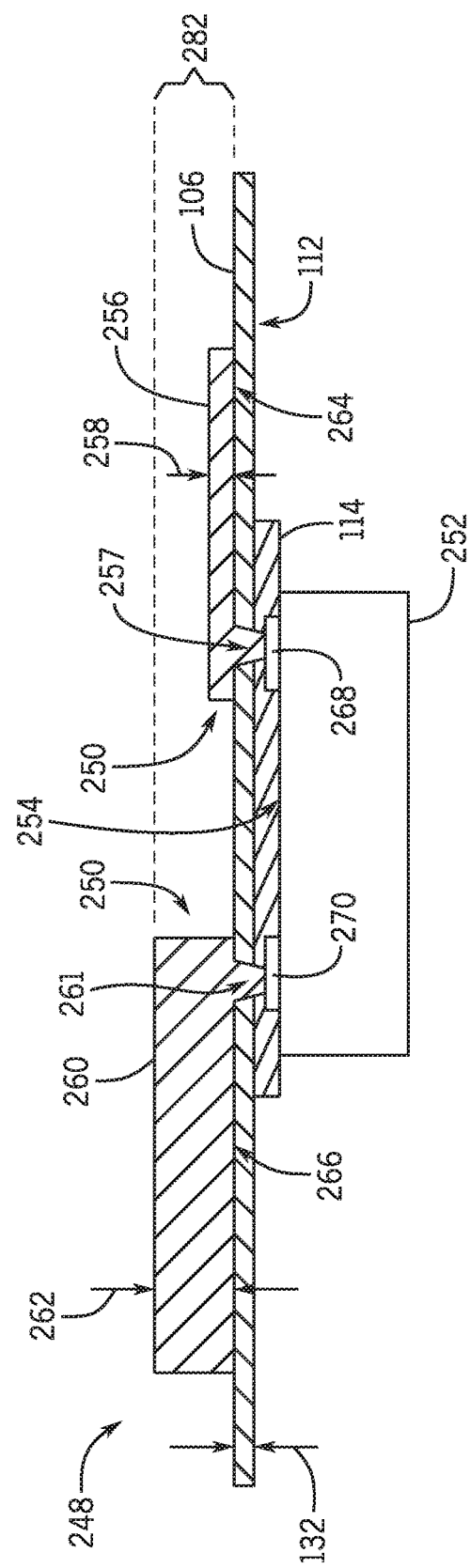
FIG. 27 is a schematic cross-sectional side view of an electronics package, according to yet another embodiment of the invention.

Another embodiment of an electronics package 248 incorporating a multi-thickness conductor layer 250 coupled to a single electrical component 252 is shown in FIG. 27. With the exception of differences in the configuration of multi-thickness conductor layer 250 and electrical component 252 described below, electronics package 248 is constructed using similar components as electronics package 210, with electrical component 252 being coupled to insulating substrate 106 by way of adhesive properties of the insulating substrate 106 itself or through an interstitial insulating material 114 positioned between the top or active surface 254 of electrical component 252 and the bottom surface 112 of insulating substrate 106.

Figure 28:
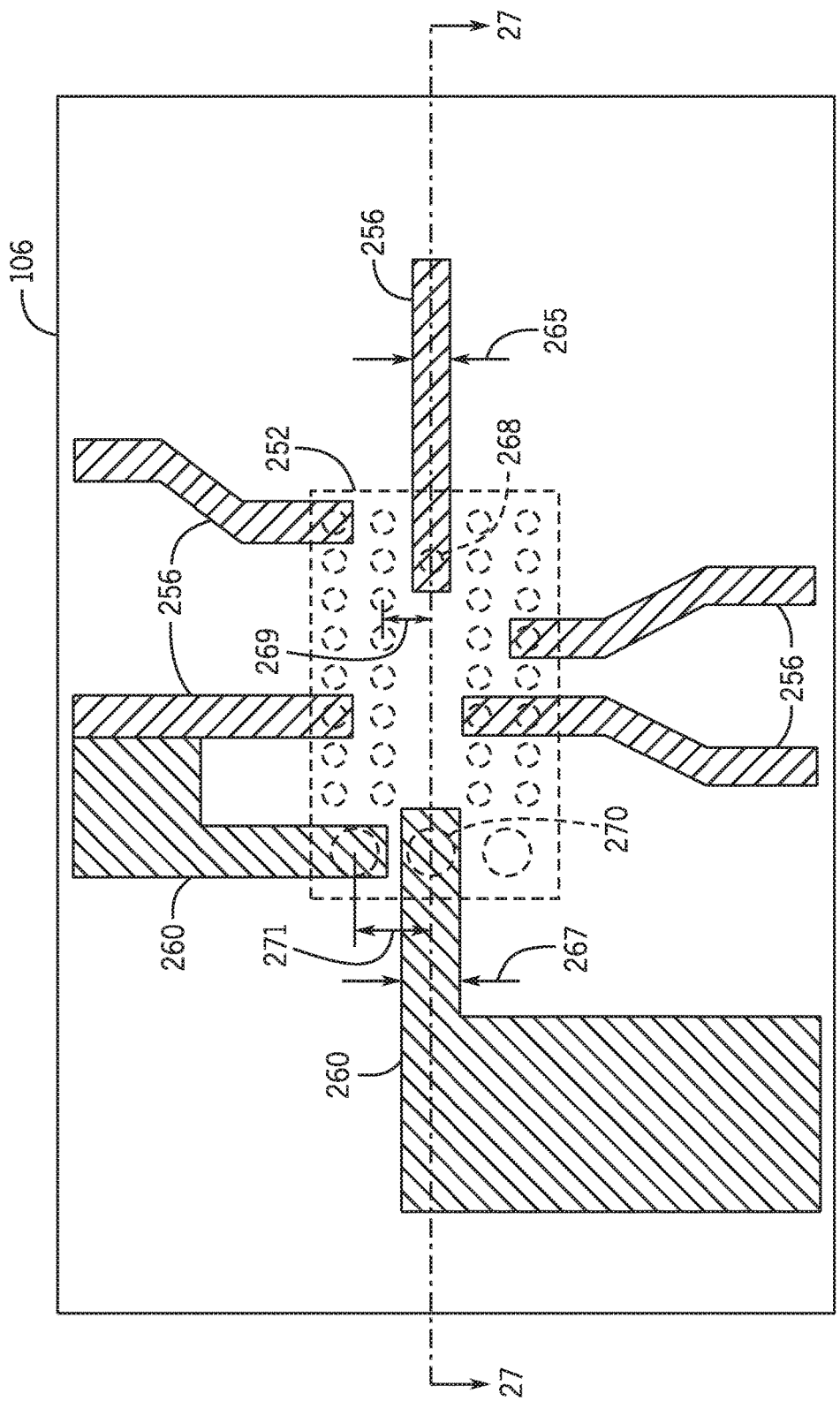
FIG. 28 is a schematic top view of the electronics package of FIG. 27.

Referring now to FIGS. 27 and 28 together as appropriate, multi-thickness conductor layer 250 is formed having conductors of differing thicknesses, with one or more conductive traces or routing paths 256 having a first thickness 258 and one or more conductive traces or routing paths 260 having a second thickness 262, which is greater than the first thickness 258. Routing paths 256 and routing paths 260 are both formed on the top surface of insulating substrate 106 and, thus the respective bottom surfaces 264, 266 thereof are coplanar or substantially coplanar. Routing paths 256 form I/O interconnections to a contact pad 268 on the top or active surface 254 of electrical component 252, while routing paths 260 form I/O interconnections to a contact pad 270 on active surface 254. As shown in FIG. 27, routing paths 256, 260 extend through respective vias 257, 261 formed through the thickness of insulating substrate 106. In the illustrated embodiment, the increased thickness 262 of routing paths 260 provides increased current carrying capabilities to contact pads 270, which may perform a different function than contact pads 268. In the case where electrical component 252 is an application specific integrated circuit (ASIC) chip, for example, contact pads 270 provide an analog input to electrical component 252 while contact pads 268 provide a digital output.

In other applications, the varied thicknesses of routing paths may be used to provide enhanced signal communication to one or more particular contact pads in instances where the intra-pad pitch limits width of the routing path to a particular contact pad. In such cases, the thickness of the routing path to a particular contact pad may be increased to provide enhanced current carrying capabilities to or from that particular pad. In applications where routing paths are made to multiple contact pads of a particular component or device, some or all of those routing paths may be formed having increased thickness regardless of the size or functionality of the corresponding contact pads and/or vias. In one non-limiting embodiment, the routing paths are formed in a manner that maximizes use of the routing paths with increased thickness. Additionally, as shown in FIG. 28, the respective widths 265, 267 of portions of routing paths 256, 260 extending outward from contact pads 268, 270 may be varied based on the pitch 269, 271 between adjacent contact pads 268, 270.

A technique for manufacturing the electronics package 248 of FIG. 28 is illustrated in FIGS. 29-33, according to one embodiment of the invention. Manufacture begins in FIG. 29 by affixing electrical component 252 to insulating substrate 106 through insulating in a similar manner as described with respect to the above embodiments. Vias 257, 261, shown in FIG. 30, are formed through insulating substrate 106 at locations aligned with contact pads 268, 270 using any of the above-described techniques. A first conductor layer 272 with a first thickness 258 is then formed on the top surface of insulating substrate 106 in a similar manner as first conductor layer 238 of FIG. 23. Optionally, a seed and adhesion layer (not shown) may be applied to insulating substrate 106 prior to formation of first conductor layer 272.

Next, a first layer photoresist mask 274 (FIG. 31) is applied atop first conductor layer 272. Portions of first conductor layer 272 aligned with first layer photoresist mask 274 are removed using an etching technique to define the traces or routing paths 256 to contact pads 268. After removing any remaining portions of first layer photoresist mask 274, a second layer photoresist mask 276 is applied to coat routing paths 256 and exposed surfaces of insulating substrate 106, as shown in FIG. 32. A second conductor layer 278 is then formed atop the remaining exposed surfaces of first conductor layer 272 to form a conductor layer having second thickness 262. Again, a dotted line is provided for explanatory purposes to differentiate the location of second conductor layer 278 from that of first conductor layer 272. An optional seed and adhesion layer (not shown) may be provided atop first conductor layer 272 prior to deposition of second conductor layer 278.

Routing paths 260, shown in FIG. 33, are formed by applying a third layer photoresist mask 280 atop second layer photoresist mask 276 and select portions of second conductor layer 278 and etching exposed portions of second conductor layer 278. Remaining portions of second layer photoresist mask 276 and third layer photoresist mask 280 are subsequently removed to yield the electronics package 248 of FIG. 28. Together, the remaining portions of first conductor layer 272 and second conductor layer 278 are positioned within a common plane 282 atop insulating substrate 106 and form multi-thickness conductor layer 250, as shown in FIG. 27.

It is contemplated that alternative techniques than those shown in FIGS. 22-26 and FIGS. 29-33 may be utilized to manufacture the electronics packages 210, 248 of FIGS. 20 and 27. In one embodiment, all or portions of the respective multi-thickness conductor layers may be formed from a photodefinable polymer using a semi-additive process. Alternatively, the masking and etching steps may be performed in a different sequence such as, for example, that described with respect to FIGS. 12-15.

Either of electronics package 210 (FIG. 20) or electronics package 248 (FIG. 28) may further include one or more redistribution layers formed atop multi-thickness conductor layers 212, 250, formed in a similar manner as all or portions of the redistribution layers described with respect to FIGS. 16-18. Similar to the electronics packages shown in FIGS. 10 and 11, either of electronics package 210 or electronics package 248 may also include a layer of insulating material that surrounds and embeds the respective electrical component 214, 252 and/or interconnect pads defining a series of I/O connections to electrical component 214, 252 through multi-thickness conductor layer 212, 250. In embodiments where electrical component 214, 252 includes one or more backside or lower contact pads, the electronics package may further include a conductive substrate coupled thereto similar to conductive substrate 158 of FIG. 11.

Therefore, according to one embodiment of the invention, an electronics package includes an insulating substrate, a first electrical component coupled to a first surface of the insulating substrate, and a second electrical component coupled to a first surface of the insulating substrate. A multi-thickness conductor layer is formed on a second surface of the insulating substrate opposite the first surface. The multi-thickness conductor layer extends through vias in the insulating substrate to connect with at least one contact pad of the first electrical component and at least one contact pad of the second electrical component. The multi-thickness conductor layer has a first thickness in a region proximate the first electrical component and a second thickness in a region proximate the second electrical component, the first thickness greater than the second thickness. The electronics package also includes a first redistribution layer having a conductor layer formed atop a portion of the multi-thickness conductor layer having the second thickness. A top surface of the conductor layer is co-planar with or substantially co-planar with a top surface of a portion of the multi-thickness conductor layer having the first thickness.

According to another embodiment of the invention, a method of manufacturing an electronics package includes providing an insulating substrate, coupling a first electrical component and a second electrical component to a first surface of the insulating substrate, and forming a multi-thickness conductor layer on a second surface of the insulating substrate, opposite the first surface. The multi-thickness conductor layer extends through a plurality of vias in the insulating substrate to electrically couple with contact pads of the first and second electrical components and has a first thickness in a region proximate the first electrical component and a second thickness in a region proximate the second electrical component, the first thickness greater than the second thickness. The method also includes forming a first redistribution layer atop a portion of the multi-thickness conductor layer having the second thickness, the first redistribution layer including a conductor layer having a top surface co-planar with or substantially co-planar with a top surface of a portion of the multi-thickness conductor layer having the first thickness.

According to yet another embodiment of the invention, an electronics package includes an insulating substrate, a first electrical component having an active surface with at least one contact pad positioned thereon coupled to a first surface of the insulating substrate, and a second electrical component having an active surface with at least one contact pad positioned thereon coupled to the first surface of the insulating substrate. A first conductor layer is disposed on a second surface of the insulating substrate and extending through metallized vias formed through a thickness of the insulating substrate. The first conductor layer has a region with a first thickness electrically coupled to at least one contact pad on the active surface of the first electrical component. The first conductor layer also has a region with a second thickness electrically coupled to at least one contact pad on the active surface of the second electrical component. The electronics package also includes a second conductor layer disposed atop a portion of the first conductor layer having the second thickness. The second conductor layer has a top surface that is co-planar with or substantially co-planar with a top surface of a portion of the first conductor layer having the first thickness.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. An electronics package comprising:
    an insulating substrate;
    a first electrical component coupled to a first surface of the insulating substrate;
    a second electrical component coupled to the first surface of the insulating substrate;
    a multi-thickness conductor layer formed on a second surface of the insulating substrate opposite the first surface, the multi-thickness conductor layer extending through vias in the insulating substrate to connect with at least one contact pad of the first electrical component and at least one contact pad of the second electrical component, wherein the multi-thickness conductor layer has a first thickness in a region proximate the first electrical component and a second thickness in a region proximate the second electrical component, the first thickness greater than the second thickness; and
    a first redistribution layer comprising a conductor layer formed atop a portion of the multi-thickness conductor layer having the second thickness, wherein a top surface of the conductor layer of the first redistribution layer is co-planar with or substantially co-planar with a top surface of a portion of the conductor layer having the first thickness.

2. The electronics package of claim 1 further comprising an insulating material provided on the first surface of the insulating substrate; and
    wherein the first electrical component and the second electrical component are coupled to the first surface of the insulating substrate by way of the insulating material.

3. The electronics package of claim 1 wherein the first electrical component comprises a power semiconductor device and the second electrical component comprises a digital semiconductor device.

4. The electronics package of claim 1 wherein a bottom surface of the multi-thickness conductor layer facing the insulating substrate is co-planar or substantially co-planar.

5. The electronics package of claim 1 wherein the region of the multi-thickness conductor layer proximate the first electrical component has a low density routing pattern and the region of the multi-thickness conductor layer proximate the second electrical component has a high density routing pattern.

6. The electronics package of claim 1 wherein the first redistribution layer comprises an insulating substrate disposed atop the portion of the multi-thickness conductor layer having the second thickness; and
    wherein the conductor layer of the first redistribution layer extends through a plurality of vias in the insulating substrate of the first redistribution layer to electrically couple with the portion of the multi-thickness conductor layer having the second thickness.

7. The electronics package of claim 1 further comprising a second redistribution layer formed atop and electrically coupled with the first redistribution layer and the portion of the multi-thickness conductor layer having the first thickness.

8. The electronics package of claim 7 further comprising an electrical component positioned between the insulating substrate and a conductor layer of the second redistribution layer, the electrical component electrically coupled to the conductor layer of the second redistribution layer.

9. The electronics package of claim 1 wherein the conductor layer of the first redistribution layer has a thickness equal to or substantially equal to the second thickness of the multi-thickness conductor layer.

10. The electronics package of claim 1 further comprising an insulating material coupled to the first surface of the insulating substrate and surrounding exposed surfaces of the first electrical component and the second electrical component.

11. The electronics package of claim 1 further comprising a conductive substrate electrically coupled to a contact pad positioned on a backside of the first electrical component.

12. The electronics package of claim 1 further comprising a plurality of input/output (I/O) connections formed on a top surface of the multi-thickness conductor layer and electrically coupled to the first electrical component and the second electrical component.

13. A method of manufacturing an electronics package comprising:
    providing an insulating substrate;
    coupling a first electrical component and a second electrical component to a first surface of the insulating substrate;
    forming a multi-thickness conductor layer on a second surface of the insulating substrate, opposite the first surface, the multi-thickness conductor layer extending through a plurality of vias in the insulating substrate to electrically couple with contact pads of the first and second electrical components, wherein the multi-thickness conductor layer has a first thickness in a region proximate the first electrical component and a second thickness in a region proximate the second electrical component, the first thickness greater than the second thickness; and
    forming a first redistribution layer atop a portion of the multi-thickness conductor layer having the second thickness, the first redistribution layer comprising a conductor layer having a top surface co-planar with or substantially co-planar with a top surface of a portion of the multi-thickness conductor layer having the first thickness.

14. The method of claim 13 wherein forming the multi-thickness conductor layer comprises:
   forming a first conductor layer on the second surface of the insulating substrate, the first conductor layer extending through the plurality of vias to electrically couple with contact pads of the first and second electrical components;
   forming a second conductor layer on a first portion of the first conductor layer proximate the first electrical component;
   patterning a second portion of the first conductor layer proximate the second electrical component to define a high density routing pattern; and
   patterning the second conductor layer and the first portion of the first conductor layer to define a low density routing pattern.

15. The method of claim 13 further comprising forming a second redistribution layer atop the first redistribution layer and atop the portion of the multi-thickness conductor having the first thickness.

16. The method of claim 15 further comprising:
   embedding at least one electronics component into an insulating material of at least one of the first redistribution layer and the second redistribution layer; and
   electrically coupling the at least one electronics component to a conductor layer of the second redistribution layer.

17. The method of claim 15 further comprising electrically coupling the second redistribution layer to the multi-thickness conductor layer.

18. The method of claim 13 further comprising surrounding the first and second electrical components with an insulating material.

19. The method of claim 13 further comprising coupling a conductive substrate to a contact pad located on a backside of the first electrical component.

20. An electronics package comprising:
   an insulating substrate;
   a first electrical component having an active surface with at least one contact pad positioned thereon coupled to a first surface of the insulating substrate;
   a second electrical component having an active surface with at least one contact pad positioned thereon coupled to the first surface of the insulating substrate;
   a first conductor layer disposed on a second surface of the insulating substrate and extending through metallized vias formed through a thickness of the insulating substrate, the first conductor layer having a region with a first thickness electrically coupled to at least one contact pad on the active surface of the first electrical component, and the first conductor layer having a region with a second thickness electrically coupled to at least one contact pad on the active surface of the second electrical component; and
   a second conductor layer disposed atop a portion of the first conductor layer having the second thickness, the second conductor layer having a top surface co-planar with or substantially co-planar with a top surface of a portion of the first conductor layer having the first thickness.

21. The electronics package of claim 20 wherein a bottom surface of the first conductor layer facing the second surface of the insulating substrate is co-planar or substantially co-planar in the region having the first thickness and the region having the second thickness.

22. The electronics package of claim 20 wherein the first electrical component comprises a power semiconductor device and the second electrical component comprises a digital semiconductor device.

23. The electronics package of claim 20 further comprising a third conductor layer formed atop the second conductor layer and the portion of the first conductor layer having the first thickness and electrically coupled thereto.

24. The electronics package of claim 23 further comprising at least one electronics component embedded between the third conductor layer and the insulating substrate.

* * * * *